(12) United States Patent
Akiba et al.

(10) Patent No.: US 9,446,937 B2
(45) Date of Patent: Sep. 20, 2016

(54) FUNCTIONAL DEVICE, ACCELERATION SENSOR, AND SWITCH

(71) Applicant: Sony Corporation, Tokyo (JP)

(72) Inventors: Akira Akiba, Kanagawa (JP); Mitsuo Hashimoto, Kanagawa (JP); Munekatsu Fukuyama, Toyko (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/554,478

(22) Filed: Nov. 26, 2014

(65) Prior Publication Data

US 2015/0183636 A1  Jul. 2, 2015

(30) Foreign Application Priority Data

Dec. 26, 2013  (JP) ................................. 2013-268870

(51) Int. Cl.

| | |
|---|---|
| *G01C 19/56* | (2012.01) |
| *B81B 7/00* | (2006.01) |
| *H01L 29/84* | (2006.01) |
| *G01P 15/125* | (2006.01) |
| *B81B 3/00* | (2006.01) |

(52) U.S. Cl.
CPC ...... *B81B 3/0051* (2013.01); *B81B 2203/0136* (2013.01)

(58) Field of Classification Search
CPC .................... B81B 3/0051; B81B 2203/0136; B81B 7/0048; B81B 2201/01; B81B 2201/0235
USPC ................................................ 257/412–422
See application file for complete search history.

(56) References Cited

U.S. PATENT DOCUMENTS

| | | | | | |
|---|---|---|---|---|---|
| 5,610,335 | A * | 3/1997 | Shaw | ..................... | B81B 3/0051 73/514.36 |
| 6,541,831 | B2 * | 4/2003 | Lee | ..................... | G02B 26/0841 257/415 |
| 6,865,944 | B2 * | 3/2005 | Glenn | ................... | B81B 3/0051 73/504.12 |
| 6,987,304 | B2 * | 1/2006 | DCamp | ................. | B81B 7/0038 257/414 |
| 2003/0102936 | A1 * | 6/2003 | Schaefer | ............... | B81B 3/0021 333/105 |
| 2004/0264847 | A1 * | 12/2004 | Koh | ..................... | G02B 6/3502 385/22 |
| 2005/0284222 | A1 * | 12/2005 | Johnson | ............. | G01C 19/5719 73/504.02 |
| 2007/0029629 | A1 * | 2/2007 | Yazdi | .................. | B81C 1/00253 257/414 |
| 2009/0260960 | A1 * | 10/2009 | Gritters | ................ | H01H 1/0036 200/181 |
| 2009/0261517 | A1 * | 10/2009 | Yao | .......................... | F16F 3/02 267/160 |
| 2010/0109102 | A1 * | 5/2010 | Chen | .................. | B81C 1/00238 257/417 |
| 2011/0120221 | A1 * | 5/2011 | Yoda | ..................... | B81B 3/0086 73/514.32 |
| 2011/0147860 | A1 * | 6/2011 | Robert | ................ | G01P 15/0802 257/415 |
| 2012/0073370 | A1 * | 3/2012 | Schubert | ............... | G01P 15/125 73/504.12 |

FOREIGN PATENT DOCUMENTS

JP  2012-528305  11/2012

* cited by examiner

*Primary Examiner* — Marc Armand
*Assistant Examiner* — Nelson Garces
(74) *Attorney, Agent, or Firm* — Michael Best & Friedrich LLP

(57) ABSTRACT

A functional device includes: a substrate; and a movable section configured to be held by the substrate and to be movable along a first direction in a surface of the substrate, in which the movable section includes a plurality of first shaft portions with relatively high rigidity, the plurality of first shaft portions are arranged side by side to extend along the first direction and to be line-symmetric to one another, and protrusions configured to brake the movable section are provided on substantially extended lines of the first shaft portions.

13 Claims, 21 Drawing Sheets

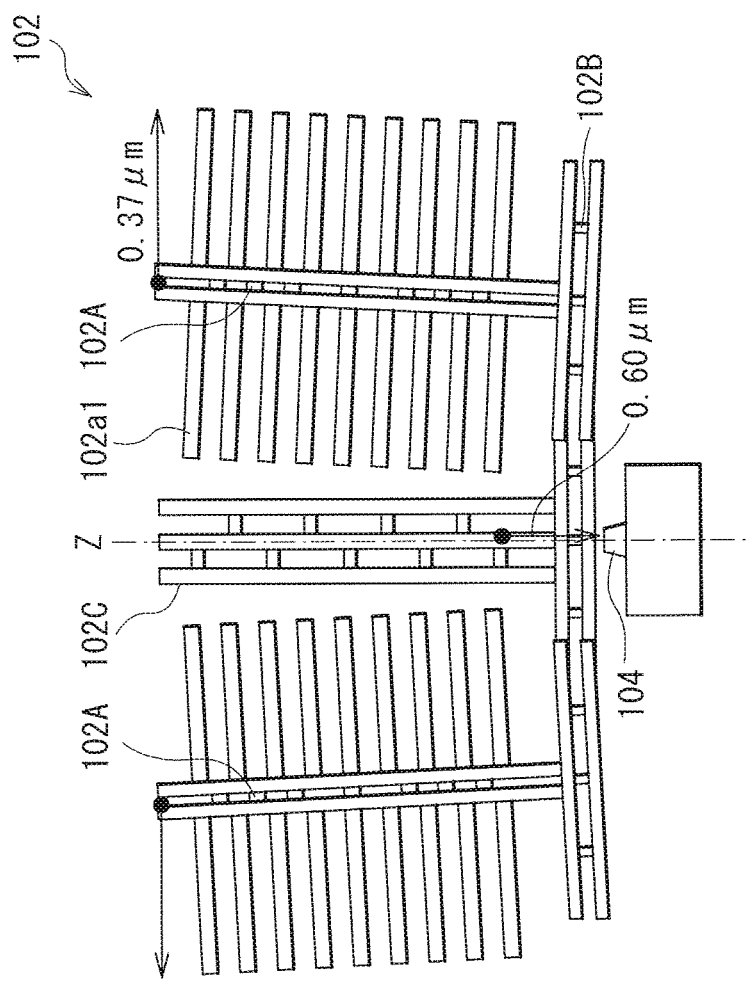

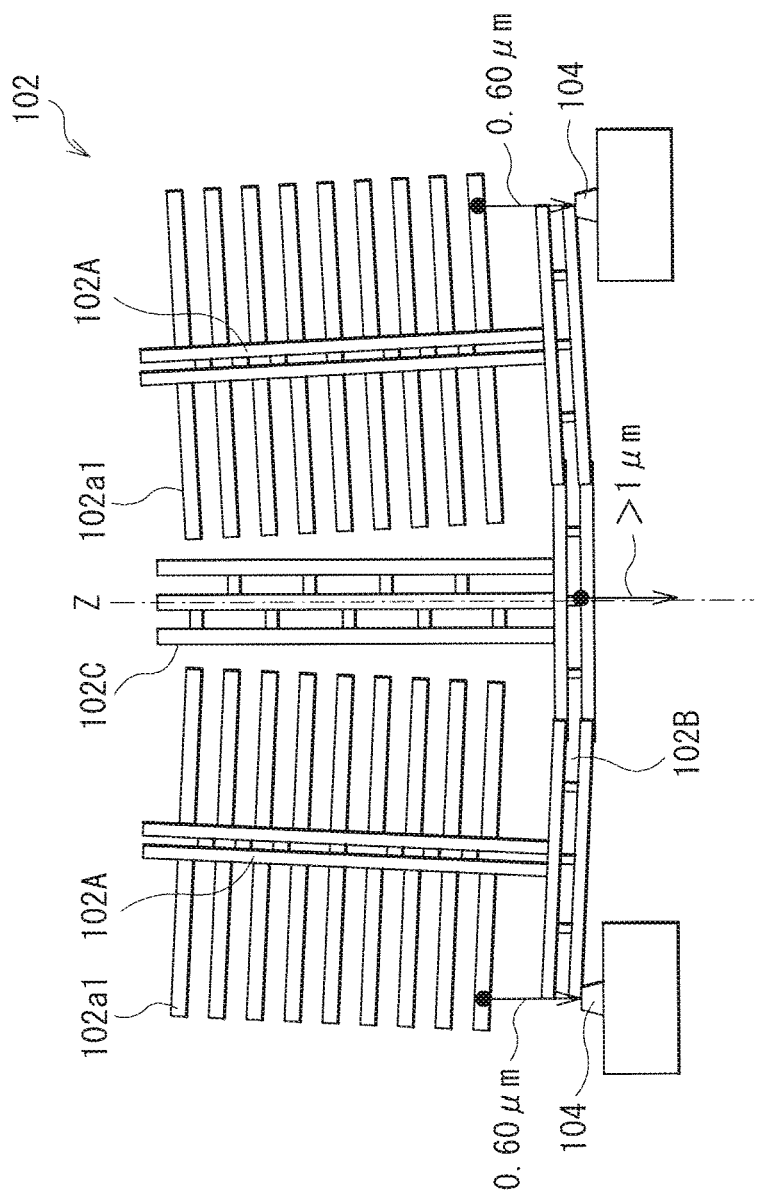

FUNCTIONAL DEVICE, ACCELERATION SENSOR, AND SWITCH

CROSS REFERENCE TO RELATED APPLICATIONS

This application claims the benefit of Japanese Priority Patent Application JP 2013-268870 filed Dec. 26, 2013, the entire contents which are incorporated herein by reference.

BACKGROUND

The present disclosure relates to a functional device using, for example, MEMS (Micro Electro Mechanical Systems) technology, and an acceleration sensor and a switch each of which uses such a functional device.

MEMS have attracted attention as elemental technology to achieve downsizing and high functionality in semiconductor devices such as acceleration sensors and high-frequency switches. The MEMS are a system configured by mixing a micro-mechanical element and an electronic circuit element by silicon process technology. When an external impact force is applied to the MEMS, a movable section of the MEMS is damaged by a stress to cause mechanical breakdown. In consideration of this, a device configuration using a so-called mechanical stopper has been proposed (for example, Japanese Unexamined Patent Application Publication (Published Japanese Translation of PCT Application) No. 2012-528305).

SUMMARY

However, in semiconductor devices using the above-described MEMS, downsizing or driving at lower voltage (voltage reduction) is highly demanded, and device configurations tend to be further miniaturized. It is desirable to achieve impact resistance capable of responding to such a demand.

It is desirable to provide a functional device capable of achieving downsizing and voltage reduction while securing impact resistance, and an acceleration sensor and a switch each of which uses such a functional device.

According to an embodiment of the present disclosure, there is provided a functional device including: a substrate; and a movable section configured to be held by the substrate and to be movable along a first direction in a surface of the substrate, in which the movable section includes a plurality of first shaft portions with relatively high rigidity, the plurality of first shaft portions are arranged side by side to extend along the first direction and to be line-symmetric to one another, and protrusions configured to brake the movable section are provided on substantially extended lines of the first shaft portions.

In the functional device according to the embodiment of the present disclosure, the movable section configured to be movable along the first direction in the surface of the substrate includes the plurality of first shaft portions with relatively high rigidity, and the plurality of first shaft portions are arranged side by side to extend along the first direction and to be line-symmetric to one another. When an external impact is applied to the functional device, in the movable section, an amount of movement in the first shaft portions is relatively large; therefore, micro-deformation of the movable section may occur to cause locally excessive movement. However, the protrusions are provided on the extended lines of the first shaft portions; therefore, such excessive movement is allowed to be effectively suppressed.

According to an embodiment of the present disclosure, there is provided an acceleration sensor provided with a functional device, the functional device including: a substrate; and a movable section configured to be held by the substrate and to be movable along a first direction in a surface of the substrate, in which the movable section includes a plurality of first shaft portions with relatively high rigidity, the plurality of first shaft portions are arranged side by side to extend along the first direction and to be line-symmetric to one another, and protrusions configured to brake the movable section are provided on substantially extended lines of the first shaft portions.

According to an embodiment of the present disclosure, there is provided a switch provided with a functional device, the functional device including: a substrate; and a movable section configured to be held by the substrate and to be movable along a first direction in a surface of the substrate, in which the movable section includes a plurality of first shaft portions with relatively high rigidity, the plurality of first shaft portions are arranged side by side to extend along the first direction and to be line-symmetric to one another, and protrusions configured to brake the movable section are provided on substantially extended lines of the first shaft portions.

In the functional device, the acceleration sensor, and the switch according to the embodiments of the present disclosure, the movable section configured to be movable along the first direction in the surface of the substrate includes the plurality of first shaft portions with relatively high rigidity, and the plurality of first shaft portions are arranged side by side to extend along the first direction and to be line-symmetric to one another. In such a configuration, the protrusions are provided on the extended lines of the first shaft portions; therefore, locally excessive movement of the movable section upon application of an impact is allowed to be effectively suppressed. Accordingly, even in a case where the configuration of the movable section is further miniaturized to achieve downsizing or voltage reduction, occurrence of electrode breakdown is allowed to be suppressed. Therefore, while impact resistance is secured, downsizing and voltage reduction are allowed to be achieved.

It is to be noted that the above description is merely examples of the embodiments of the present disclosure. Effects of the embodiments of the present disclosure are not limited to effects described here, and may be different from the effects described here or may further include any other effect.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the technology, and are incorporated in and constitute a part of this specification. The drawings illustrate embodiments and, together with the specification, serve to explain the principles of the technology.

FIG. 11A is a schematic view illustrating a braking operation by an arrangement of a protrusion according to Comparative Example 1-1.

FIG. 11B is a schematic view illustrating a braking operation by an arrangement of a protrusion according to Comparative Example 1-2.

DETAILED DESCRIPTION

Some embodiments of the present disclosure will be described in detail below referring to the accompanying drawings. It is to be noted that description will be given in the following order.

1. First Embodiment (Example of an MEMS device in which a protrusion is provided to face a first shaft portion of a movable section)

2. Second Embodiment (Example of a MEMS device in which a protrusion and a spring are provided to face the first shaft portion of the movable section)

3. Third Embodiment (Example of a MEMS device in which a protrusion covered with an organic film is provided to face the first shaft portion of the movable section)

4. Fourth Embodiment (Example of an acceleration sensor to which any of the MEMS devices is applied)

5. Fifth Embodiment (Example of a switch to which any of the MEMS devices is applied)

First Embodiment

[Configuration]

Figure 1:
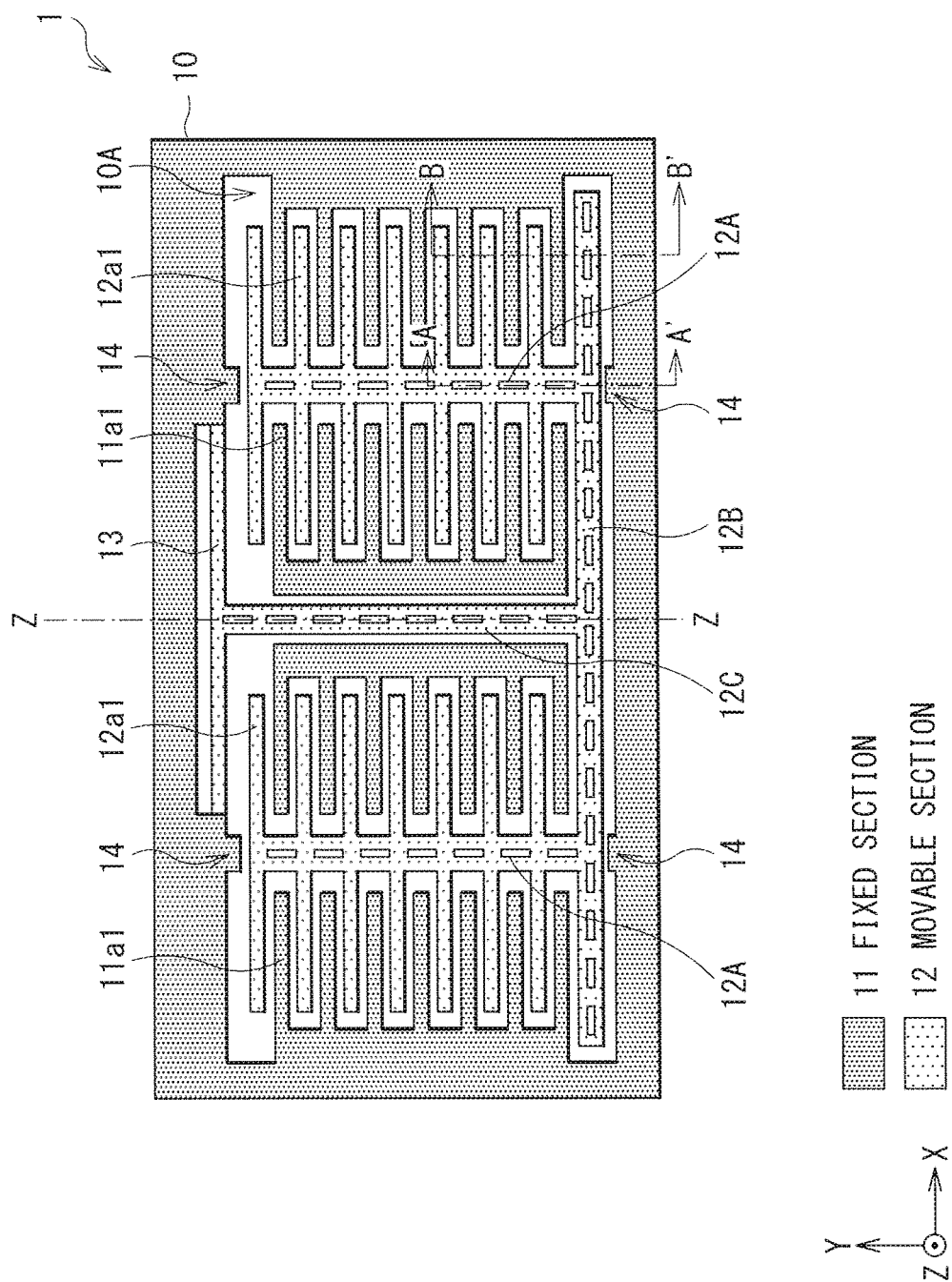
FIG. 1 is a schematic plan view illustrating a configuration of a functional device (a MEMS device) according to a first embodiment of the present disclosure.

FIG. 1 illustrates an XY planar configuration of a functional device (a MEMS device 1) according to a first embodiment of the present disclosure. The MEMS device 1 is a micro-structure including a mechanical element and an electrical element that will be described below, and may be suitably used for, for example, an acceleration sensor, a switch, and the like that will be described later.

In the MEMS device 1, a movable section 12 is suspended in, for example, a cavity 10A (a recessed section) of a substrate 10. A portion acting on the movable section 12 of the substrate 10 is a fixed section 11. The fixed section 11 and the movable section 12 are collectively formed by performing three-dimensional microfabrication using lithography technology on a surface of the substrate 10. Moreover, the movable section 12 is formed as an integrated structure including all of a first shaft portion 12A, a second shaft portion 12B, a third shaft portion 12C, and a movable electrode 12a1 that will be described later.

The substrate 10 may be made of, for example, a Si-based semiconductor such as silicon (Si), silicon carbide (SiC), silicon-germanium (SiGe), and silicon-germanium-carbon (SiGeC). Alternatively, a non-Si-based material such as glass, a resin, and plastic may be used. Moreover, as the substrate 10, a SOI (Silicon on Insulator) substrate or the like may be used.

The cavity 10A may be, for example, a space to hold and move the movable section 12 in the substrate 10. The cavity 10A has a wall surface (corresponding to a side surface of the fixed section 11) perpendicular to an XY plane. In this embodiment, as will be described in detail later, a protrusion 14 is provided to a selective portion of the wall surface of the cavity 10A.

The fixed section 11 is a portion acting on the movable section 12 of the substrate 10, and includes a plurality of fixed electrodes 11a1 (second electrodes). In the fixed section 11, a signal line or the like connected to an electronic circuit (not illustrated) is formed to allow input and output of a signal through the fixed electrodes 11a1.

The movable section 12 is held movably (including vibration and reciprocation) in the cavity 10A. More specifically, the movable section 12 is connected to the fixed section 11 of the substrate 10 through, for example, a return spring 13, and is movable along one direction (a "first direction" in an embodiment of the present disclosure; a Y direction in this case).

The movable section 12 includes a plurality of (two in this case) first shaft portions 12A, the second shaft portion 12B connected to the plurality of first shaft portions 12A, and the third shaft portion 12C. The plurality of first shaft portions 12A are arranged side by side to extend along the Y direction and to be line-symmetric to one another with respect to an operation axis Z including a mass center point (a barycenter) of the movable section 12. The second shaft portion 12B is connected to ends on one side or ends on both sides of the first shaft portions 12A. In this case, an example in which the second shaft portion 12B is connected to ends on one side (ends on a bottom side in the diagram) of the first shaft portions 12A is illustrated as an example. The third shaft portion 12C is a portion as a main shaft (a central shaft) of the movable section 12. The third shaft portion 12C supports the first shaft portions 12A and the second shaft portion 12B, and is connected to the return spring 13. Moreover, in this case, the third shaft portion 12C is arranged on the operation axis Z, and two first shaft portions 12A are arranged to be line-symmetric to each other with respect to the third shaft portion 12C.

In this case, the mechanical element configuring the MEMS device 1 is typically configured of an elastic body or a rigid body. The elastic body may be used for a spring portion (for example, the return spring 13) or the like of the movable section 12. The rigid body is used for the fixed section 11, and in the movable section 12, the rigid body is used for the first shaft portions 12A, the second shaft portion 12B, the movable electrode 12a1 that will be described later, and the like. It is to be noted that a boundary between the elastic body and the rigid body differs depending on a design purpose. In this embodiment, it is noted that the first shaft portions 12A, the second shaft portion 12B, the movable electrode 12a1, and the like that are typically treated as the rigid bodies are not deformed during an operation within their rating, but micro-deformation of them occurs (by about 10 nm to about 10 μm) upon application of an impact; therefore, they are treated as "substantially rigid bodies".

Figure 2A:
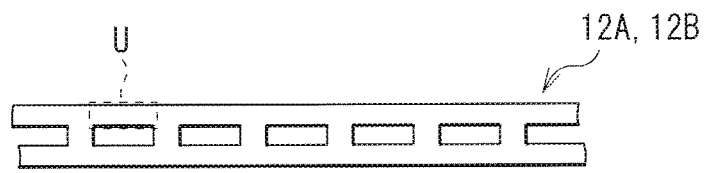
FIG. 2A is a schematic view illustrating a configuration example (a substantially rigid body) of a first shaft portion and a second shaft portion illustrated in FIG. 1.
Figure 2B:
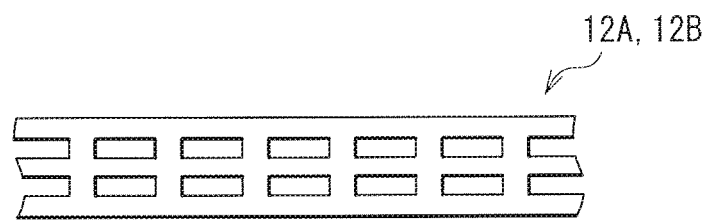
FIG. 2B is a schematic view illustrating a configuration example (a substantially rigid body) of the first shaft portion and the second shaft portion illustrated in FIG. 1.
Figure 2C:
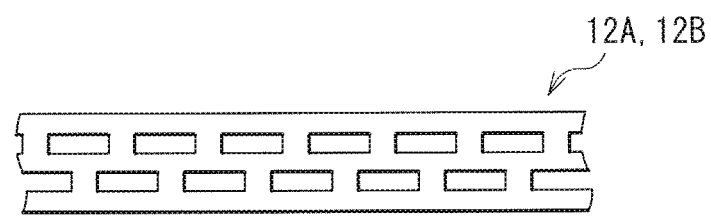
FIG. 2C is a schematic view illustrating a configuration example (a substantially rigid body) of the first shaft portion and the second shaft portion illustrated in FIG. 1.
Figure 2D:
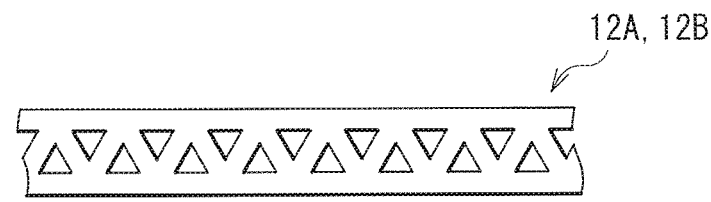
FIG. 2D is a schematic view illustrating a configuration example (a substantially rigid body) of the first shaft portion and the second shaft portion illustrated in FIG. 1.
Figure 3:
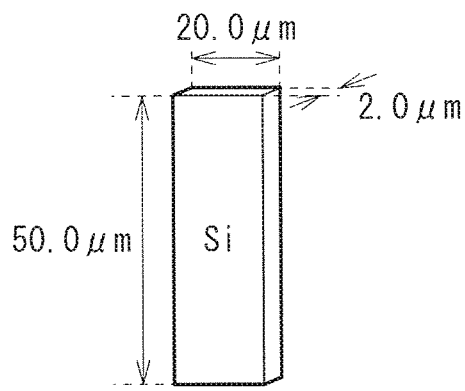
FIG. 3 is a schematic view illustrating a unit configuration of the first shaft portion and the second shaft portion illustrated in FIGS. 2A to 2D.
Figure 4:
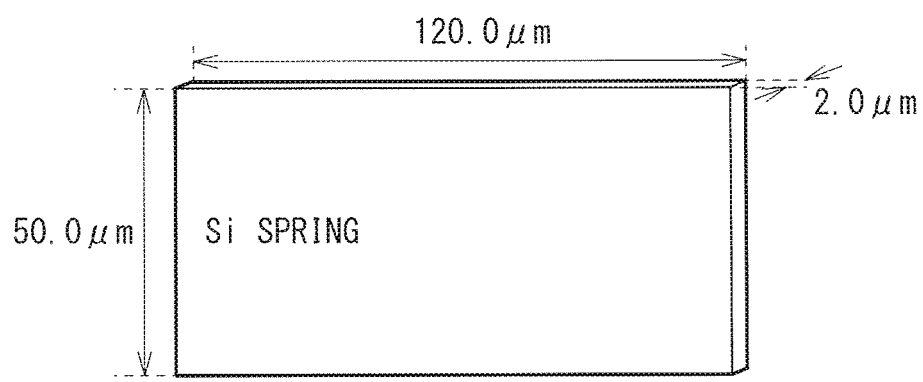
FIG. 4 is a schematic view illustrating a configuration example of an elastic body.

For example, each of the first shaft portions 12A, the second shaft portion 12B, and the third shaft portion 12C has a structure that is so configured as to have relatively high rigidity in the movable section 12 as the substantially rigid body. Examples of such a structure may include a ladder-like structure, a mesh-like structure, and a honeycomb-like structure. Examples of the structure are illustrated in FIGS. 2A to 2D. It is to be noted that each of these diagrams corresponds to an XY planar configuration. Moreover, FIG. 3 illustrates an example of dimensions of, for example, a unit portion U illustrated in FIG. 2A, and FIG. 4 illustrates an example of dimensions of an elastic body portion. In the rigid bodies, while a sectional area is increased, an increase in an effective mass is allowed to be reduced by a combination of the unit portion U as illustrated in FIG. 3, thereby enhancing rigidity. Moreover, the rigid bodies (the substantially rigid bodies) and the elastic body are formed under substantially same layout rules (a line, a space, a maximum value or a minimum value of the line and the space, coverage, an aperture ratio, and the like) in consideration of ease of processing.

Figure 5A:
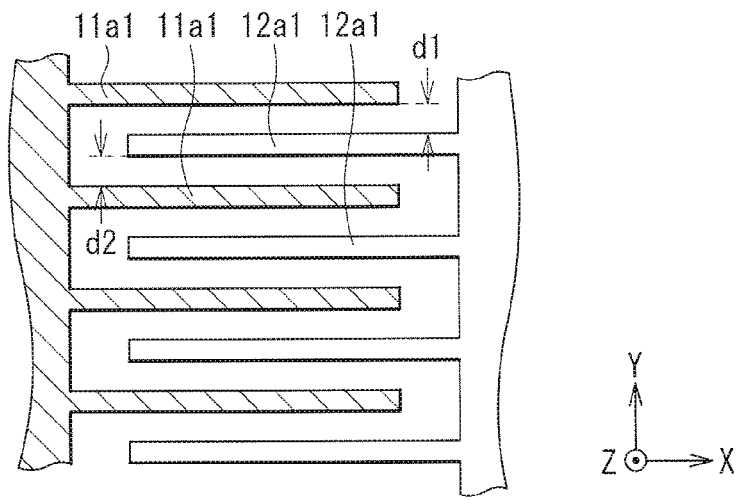
FIG. 5A is a schematic plan view for describing specific configurations of fixed electrodes and movable electrodes illustrated in FIG. 1.
Figure 5B:
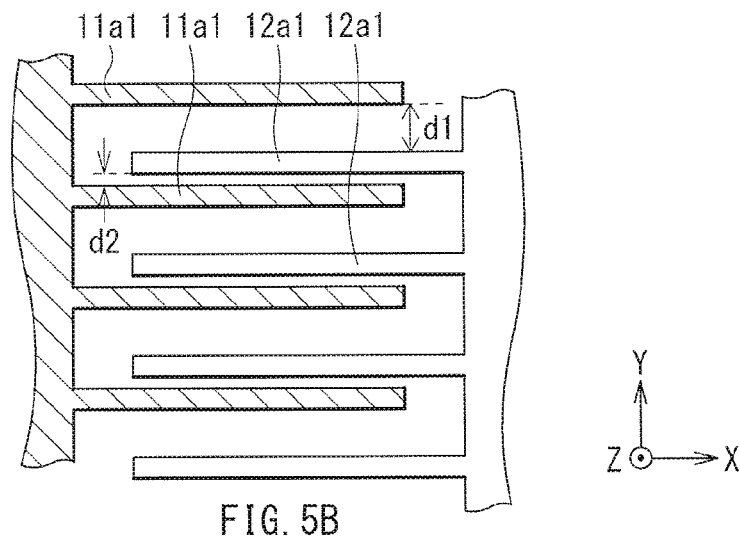
FIG. 5B is a schematic plan view for describing specific configurations of the fixed electrodes and the movable electrodes illustrated in FIG. 1.
Figure 5C:
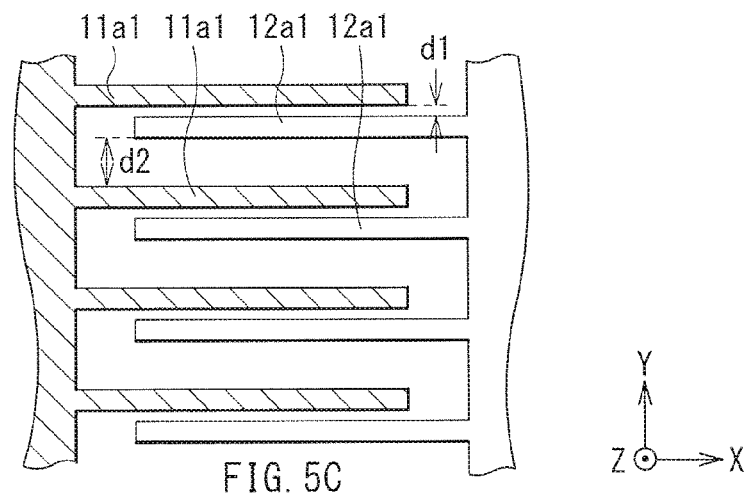
FIG. 5C is a schematic plan view for describing specific configurations of the fixed electrodes and the movable electrodes illustrated in FIG. 1.

In each of the first shaft portion 12A, a plurality of flat movable electrodes 12a1 are provided. FIGS. 5A to 5C illustrate specific configurations of the movable electrodes 12a1 and the fixed electrodes 11a1.

Each of the plurality of movable electrodes 12a1 is a portion protruded from the first shaft portion 12A, thereby allowing an entire shape thereof to have a comb-tooth-like shape. These movable electrodes 12a1 may be arranged at fixed intervals, for example, along an extending direction (the Y direction) of the first shaft portion 12A.

The plurality of fixed electrodes 11a1 are arranged to be alternated with the movable electrodes 12a1, and an entire shape of each of the fixed electrodes 11a1 has a comb-tooth-like shape. These fixed electrodes 11a1 may be arranged at fixed intervals, for example, along the extending direction (the Y direction) of the first shaft portion 12A. In the cavity 10A, the movable section 12 is held to allow the above-described comb-tooth-like shapes of the movable electrodes 12a1 and the fixed electrodes 11a1 to engage with each other.

The movable electrodes 12a1 and the fixed electrodes 11a1 are arranged with predetermined gaps in between. The sizes (intervals d1 and d2) of the gaps may be equal to or different from each other in a no-voltage application state (a neutral state). In this case, one movable electrode 12a1 is sandwiched between two fixed electrodes 11a1, and the size of the gap between the movable electrode 12a1 and one of the fixed electrodes 11a1 is d1, and the size of the gap between the movable electrode 12a1 and the other fixe electrode 11a1 is d2. As illustrated in FIG. 5A, the movable electrode 12a1 may be arranged to allow the interval d1 and the interval d2 to be equal to each other, or as illustrated in FIGS. 5B and 5C, the movable electrode 12a1 may be arranged in a position where the interval d1 and the interval d2 are different from each other (a position shifted from a position where the intervals d1 and d2 are equal to each other). In FIG. 5B, the position of the movable electrode 12a1 is offset to allow the interval d1 to be larger than the interval d2, and in FIG. 5C, the position of the movable electrode 12a1 is offset to allow the interval d1 to be smaller than the interval d2.

The position of the movable electrode 12a1 in the no-voltage application state may be preferably set suitably depending on the configuration, purpose, and the like of the movable section 12. For example, in terms of mass and the like, the position of the movable electrode 12a1 may be preferably set to a position shifted toward a side where the second shaft portion 12B is connected. Therefore, in this embodiment, the position of the movable electrode 12a1 is offset, for example, as illustrated in FIG. 5B. It is to be noted that in a case where the second shaft portion 12B is connected to both ends of the first shaft portions 12A or for use in an acceleration sensor, the position of the movable electrode 12a1 may not be preferably offset, but the movable electrode 12a1 may be preferably so arranged as to allow the intervals d1 and d2 to be equal to each other.

(Configuration of Protrusion 14)

The protrusions 14 are provided on extended lines (hereinafter referred to as "substantially extended lines") of the first shaft portions 12A of the movable section 12 as described above. The protrusions 14 are configured to function as so-called mechanical stoppers, and to brake the movable section 12.

Figure 6A:
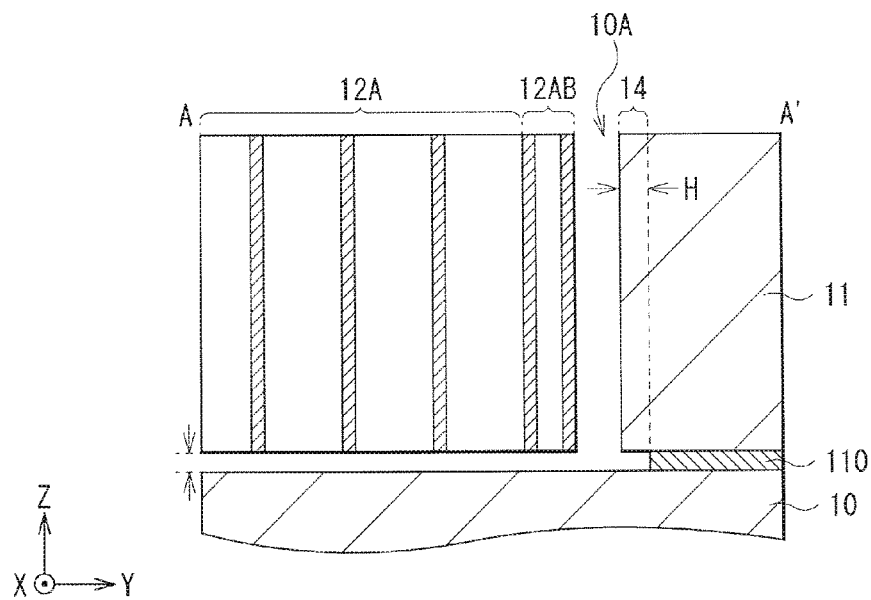
FIG. 6A is a sectional view taken along an A-A' line of FIG. 1.
Figure 6B:
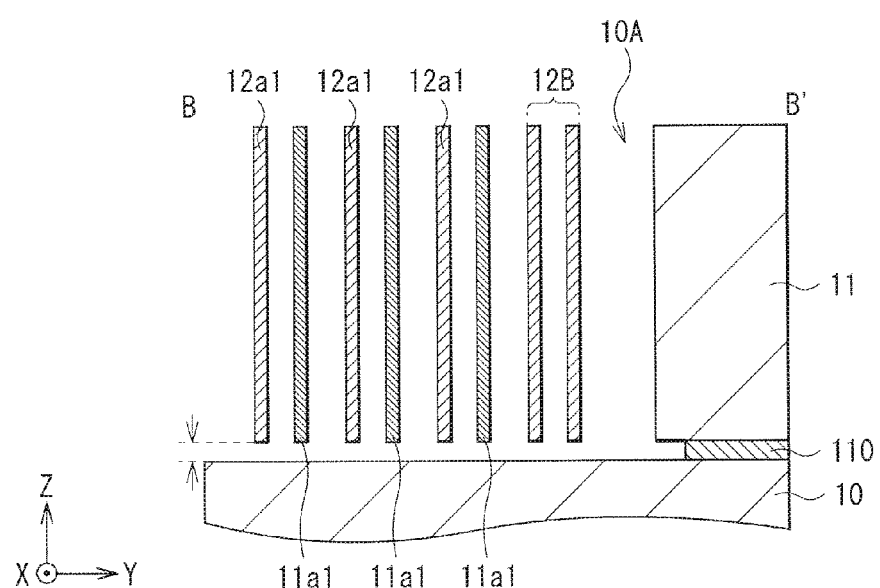
FIG. 6B is a sectional view taken along a B-B' line of FIG. 1.

FIG. 6A illustrates a sectional configuration taken along an A-A' line of FIG. 1, and FIG. 6B illustrates a sectional configuration taken along a B-B' line of FIG. 1. The protrusions 14 are formed in one or both of the movable section 12 and the cavity 10A (more specifically, the wall surface of the cavity 10A). However, in a case where the second shaft portion 12B is connected to the first shaft portion 12A, each of the protrusions 14 may be preferably provided to face a connection point (a connection section 12AB) between the first shaft portion 12A and the second shaft portion 12B. In this embodiment, the protrusions 14 are provided to the wall surface of the cavity 10A (a side surface of the fixed section 11) on ends on both sides of the first shaft portions 12A. More specifically, the protrusions 14 are arranged in total four positions facing ends on both sides of two first shaft portions 12A arranged line-symmetrically with respect to the operation axis Z. Ease of processing is enhanced by providing the protrusions 14 to the fixed section 11 in a manner similar to this embodiment.

In this case, as described above, each of the first shaft portions 12A is a substantially rigid body, and is a relatively easily movable portion in the movable section 12. The ease of operation of the first shaft portion 12A is higher than that of other portions. Therefore, the movement that will be described later of the movable section 12 is allowed to be effectively braked by providing the protrusions 14 on the extended lines of the first shaft portions 12A. However, the number of the provided protrusions 14 is not limited to four. For example, the protrusions 14 may be provided to, for example, total two points facing ends on one side of two first shaft portions 12A. In other words, the protrusions 14 may be provided to ends on one of both sides of the first shaft portions 12A on the extended lines of the first shaft portions 12A, or as with this embodiment, the protrusions 14 may be provided to ends on both sides of the first shaft portions 12A on the extended lines of the first shaft portions 12A. Moreover, even in a case where a vector targeted for braking is increased, impact resistance is allowed to be improved by forming the protrusion 14 on an extended line of a relatively easily movable shaft portion.

For example, as illustrated in FIG. 6A, the protrusions 14 are formed integrally with the fixed section 11 (the substrate 10). Moreover, the protrusions 14 are collectively formed with the movable section 12, the cavity 10A, and the like by etching with use of lithography. Therefore, the protrusions 14 have an equal height H from a surface of the fixed section 11 to a vicinity of a bottom surface of the cavity 10A. It is to be noted that this example has a configuration in which a silicon layer configuring the fixed section 11 is laminated on the substrate 10 with a silicon oxide film 110 in between. With use of such a laminate configuration, the movable section 12 suspended in the cavity 10A is allowed to be formed by two stages of etching. More specifically, first, the fixed section 11 is dug by anisotropic etching until a surface of the silicon oxide film 110 is exposed, and then the silicon oxide film 110 is removed by isotropic etching. Accordingly, the protrusions 14 are allowed to be formed concurrently with forming a suspension configuration of the movable section 12 as illustrated in FIGS. 6A and 6B.

Figure 7:
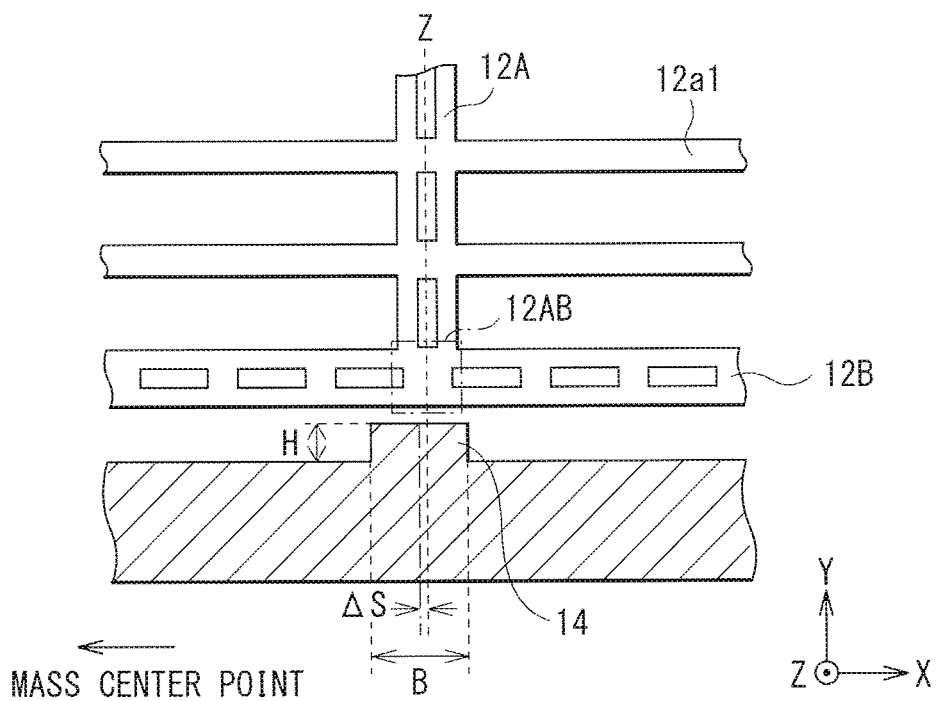
FIG. 7 is an enlarged schematic view illustrating a peripheral portion of a protrusion illustrated in FIG. 1.

As described above, the protrusions 14 are provided on the extended lines of the first shaft portions 12A, and more specifically, each of the protrusions 14 may be preferably provided in a position slightly shifted from a position directly facing an end of the first shaft portion 12A. FIG. 7 schematically illustrates a specific configuration of the protrusion 14. Thus, the protrusion 14 is arranged in a position shifted by an extremely small distance Δs from a position directly facing the first shaft portion 12A (i.e., the operation axis Z) toward the mass center point. A width D and the height H of the protrusion 14 are set to appropriate sizes according to magnitude of an external force, rigidity of the movable section 12, and the like. It is because the larger the external force is, or the lower the rigidity is, the more a curvature (the degree of a curve by deformation) of the movable section 12 (for example, the second shaft portion 12B) is increased. Therefore, qualitatively, a large contact area of the protrusion 14 with the movable section 12 may be preferably secured. As one example of the width B, the width B may be about 1.0 μm to about 10.0 μm, and as one example of the height H, the height H may be about 0.1 μm to about 3.0 μm. Moreover, the extremely small distance Δs may be, for example, about a few nm to about a few tens of nm.

Figure 8A:
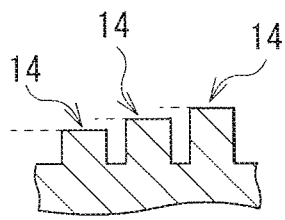
FIG. 8A is a schematic sectional view illustrating another layout example of the protrusion.
Figure 8B:
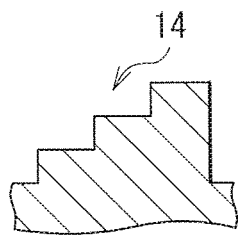
FIG. 8B is a schematic sectional view illustrating another shape example of the protrusion.

The number of protrusions 14 provided to face an end (the connection section 12AB) of one first shaft portion 12A (the number of protrusions 14 provided to one position) may be one, or two or more. In this embodiment, one protrusion 14 is provided to one position; however, for example, as illustrated in FIG. 8A, three protrusions 14 may be provided to one position. In this case, a plurality of protrusions 14 are so provided as to allow heights thereof to be increased in order from a side close to the mass center point, and a height difference is provided between the protrusions 14. Thus, when a plurality of protrusions 14 are provided to one position, the movable section 12 comes into contact with one protrusion 14 on, for example, the extended line of the first shaft portion 12A, and then comes into contact with another protrusion 14 located outside or inside the one protrusion 14. A braking force is allowed to substantially continuously or discretely act on movement and deformation of the movable section 12. However, one protrusion 14 with which the movable section 12 first comes into contact contributes the most to effects of an embodiment of the present disclosure. It is to be noted that, as illustrated in FIG. 8B, the protrusion 14 may have a stepwise shape (a shape in which a height is changed in a stepwise manner), and even in this case, similar effects are allowed to be obtained.

Figure 8C:
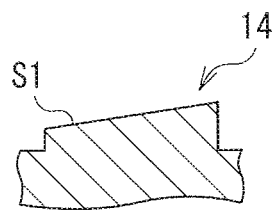
FIG. 8C is a schematic sectional view illustrating another shape example of the protrusion.
Figure 8D:
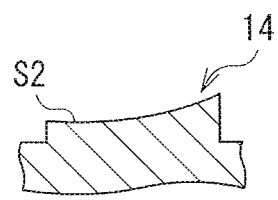
FIG. 8D is a schematic sectional view illustrating another shape example of the protrusion.
Figure 8E:
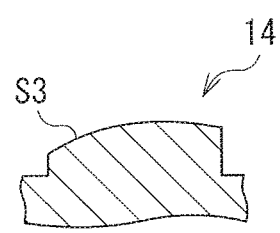
FIG. 8E is a schematic sectional view illustrating another example of the protrusion.

The shape (an XY sectional shape) of the protrusion 14 may be, for example, a rectangular shape. However, the shape of the protrusion 14 is not limited to the rectangular shape, but may be a square shape, or a rounded shape such as a semicircular shape. Moreover, the protrusion 14 may have a tapered surface S1 as illustrated in FIG. 8C, or may have a curved surface (a concave surface) S2 as illustrated in FIG. 8D. For example, the second shaft portion 12B is slightly curved by micro-deformation of the movable section 12; therefore, the shape of the protrusion 14 is allowed to fit the side surface shape of such a second shaft portion 12B, and more effective braking is achievable. Alternatively, the protrusion 14 may have a curved surface (a convex surface) S3 as illustrated in FIG. 8E.

The positions and the shapes of the above-described protrusions 14 may be preferably so designed as to be line-symmetric to each other in the MEMS device 1.

[Functions and Effects]

Figure 9:
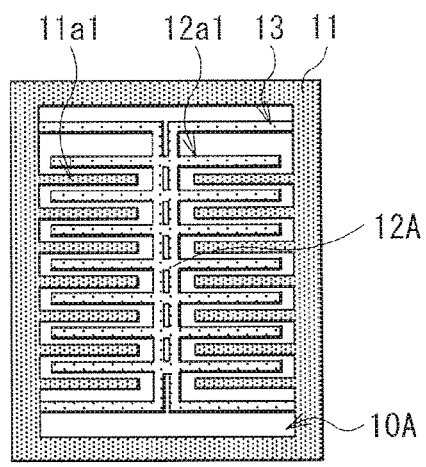
FIG. 9 is a schematic view for describing a state of the movable electrode during an operation within its rating.

In the MEMS device 1 according to this embodiment, during an operation within its rating, the movable section 12 moves along the operation axis Z within a predetermined range in the cavity 10A of the substrate 10. In other words, as illustrated in FIG. 9, the movable electrodes 12a1 come close to the fixed electrodes 11a1, but do not come into contact with the fixed electrodes 11a1. It is to be noted that FIG. 9 illustrates a configuration of only a part of the MEMS device 1. For example, for use in an actuator such as a switch that will be described later, when an electrical signal is applied to, for example, the fixed electrodes 11a1 and the movable electrodes 12a1 through a signal line (not illustrated), the movable section 12 is driven by an electrostatic force, thereby controlling an electrical open-close state. Alternatively, for use in the acceleration sensor, for example, change in capacitance between the fixed electrodes 11a1 and the movable electrodes 12a1 is allowed to be measured, thereby detecting acceleration by arithmetic processing based on a measurement result.

Figure 10A:
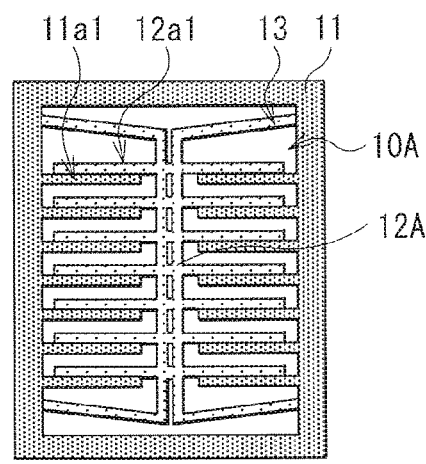
FIG. 10A is a schematic view for describing a state of the movable electrode upon application of an impact force (within an allowable range).
Figure 10B:
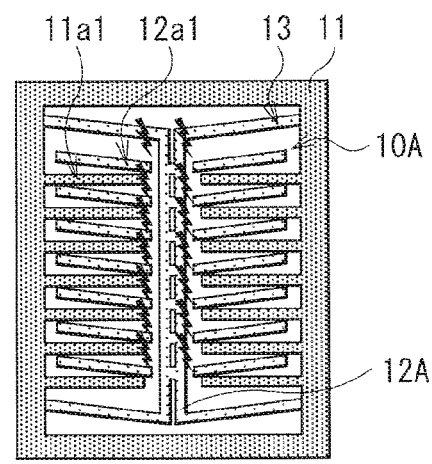
FIG. 10B is a schematic view for describing a state of the movable electrode upon application of an impact force (out of the allowable range).

In such a MEMS device 1, when an external force (an impact force) is applied thereto, the movable section 12 is moved. At this time, in a case where an impact force within an allowable range is applied, as illustrated in FIG. 10A, the movable electrodes 12a1 may come into contact with the fixed electrodes 11a1, but are not broken. On the other hand, in a case where an impact force exceeding the allowable range (for example, an impact force allowing a maximum stress on the movable section 12 to exceed 1 GPa) is applied, as illustrated in FIG. 10B, the movable electrodes 12a1 come into contact with the fixed electrodes 11a1, and are pressed, thereby causing electrode breakdown by a stress caused by pressing. For example, in a case where the movable electrode 12a1 is configured of a silicon plate with a thickness of about 2 µm and a length of about 70 µm, the movable electrode 12a1 may suffer damage such as curving or bending in a base portion of the first shaft portion 12A.

Therefore, in this embodiment, in the MEMS device 1, the protrusions 14 are used as mechanical stoppers to allow a stress applied to the movable section 12 to fall within an allowable range. The movable section 12 is braked by the protrusions 14, and occurrence of the above-described electrode breakdown is suppressed.

Comparative Examples

Various mechanical stoppers have been proposed. Moreover, there has been proposed a protrusion used as a mechanical stopper. However, in these mechanical stoppers, the position of the protrusion is not optimized, and it is difficult to sufficiently brake a movable section. For example, as comparative examples, FIG. 11A illustrates a case where a protrusion 104 is arranged only on the operation axis Z of a movable section 102 (Comparative Example 1-1), and FIG. 11B illustrates a case where the protrusions 104 are arranged in outermost sections (both end sections) of the movable section 102 (Comparative Example 1-2). In these comparative examples, a movable section 102 of a MEMS device includes two first shaft portions 102A that are arranged side by side to be line-symmetric with each other, a second shaft portion 102B connected to the two first shaft portions 102A, and a third shaft portion 102C as a main shaft (a central shaft). A plurality of movable electrodes 102a1 are protruded from each of the first shaft portions 102A in a combtooth form.

As illustrated in FIG. 11A, in Comparative Example 1-1, in a case where the protrusion 104 is arranged on, for example, an extended line of a mass point of the entire movable section 102, movement on the operation axis Z (movement of the third shaft portion 102C) is allowed to be braked. For example, the amount of the movement may be kept at about 0.6 µm. However, after the movable section 102 comes into contact with the protrusion 104 on the operation axis Z, for example, two first shaft portions 102A are moved to open outward, and the movable section 102 is deformed. The amount of the movement may be, for example, about 0.37 µm or more. Thus, micro-deformation (local vibration) of the movable section 102 is not allowed to be prevented.

On the other hand, as illustrated in FIG. 11B, in Comparative Example 1-2, in the case where the protrusions 104 are arranged in the outermost sections (both end sections) of the movable section 102, movement of both end sides of the movable section 102 is allowed to be braked. For example, the amount of the movement may be kept at about 0.6 µm. However, the amount of movement on the operation axis Z becomes too large (for example, about 1 µm or more), and the amount of movement becomes nonuniform, thereby deforming the movable section 102. Thus, micro-deformation of the movable section 102 is not allowed to be prevented.

In Comparative Examples 1-1 and 1-2, the movable section 102 is designed as one inertial body. Alternatively, the movable section 102 is treated as a rigid body configured of a plurality of inertial bodies. In other words, micro-deformation as described above has not been an issue, and braking by the protrusion 104 is not sufficient. Moreover, in a MEMS mechanism, intervals between electrodes with a combtooth-like shape may be extremely small, for example, about 1.0 µm or less. Therefore, when locally excessive movement of the movable electrodes 102a1 is caused by the above-described micro-deformation, electrode breakdown is more likely to occur. When the number of electrodes is increased or when intervals between the electrodes are reduced to achieve downsizing of the MEMS mechanism and voltage reduction, the electrode breakdown is more likely to occur.

Moreover, since miniaturization of the MEMS device advances by an increase in the electrode number and reduction in intervals between electrodes, high processing accuracy is desired. However, in existing electrode designs, a fine surface shape is not considered. When miniaturization of the MEMS, in particular, reduction in intervals between electrodes advances, it is desirable to design a braking mechanism (protrusion), based on processing accuracy. For example, in a process of dry etching, asperities spaced at intervals of about 0.05 µm or less are formed on an electrode surface by an influence of a scallop or the like. It means that in a case where a design value of intervals between electrodes is, for example, about 0.5 µm, the intervals between electrodes may have an error of about 10%. Likewise, a braking distance by the protrusion may have an error of about 10%. Moreover, the error is linearly increased with an increase in a distance from the protrusion; therefore, for example, in a device with a width of about 500 µm, even if rotation at the protrusion is suppressed to +1°, as an amount of movement of an electrode located about 250 µm outside from a center, the electrode is moved more excessively by about 4 μm than the protrusion due to asperities on the surface. This is a factor causing stress breakdown at an external end of the device.

Figure 12A:
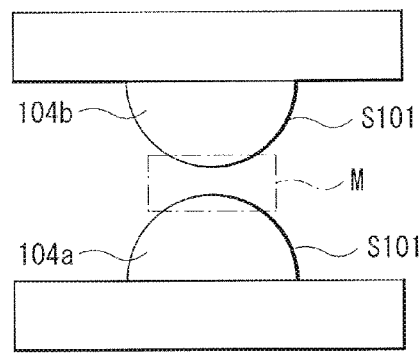
FIG. 12A is a schematic view illustrating a braking system according to Comparative Example 2.
Figure 12B:
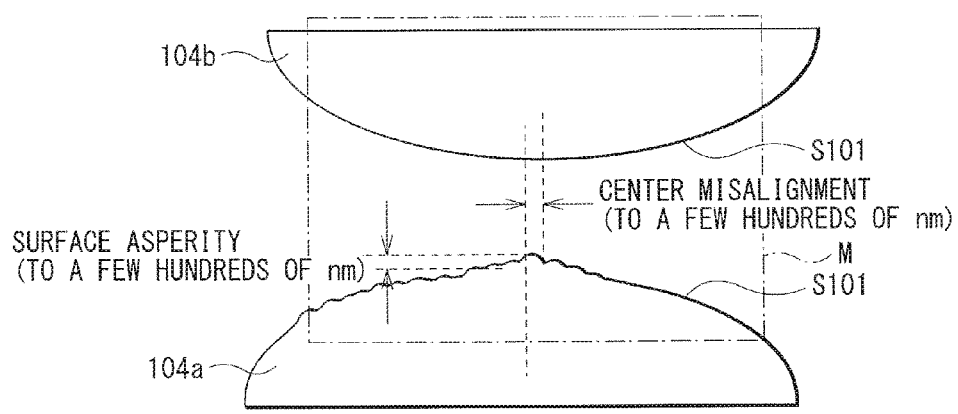
FIG. 12B is an enlarged view of a part of the braking system illustrated in FIG. 12A.

FIG. 12A illustrates an example of a braking mechanism using a pair of spherical protrusions 104 as Comparative Example 2. In Comparative Example 2, a movable section is braked by contact between spherical surfaces S101 of the pair of protrusions 104. However, in such a braking mechanism, in terms of the above-described processing accuracy, movement (rotation and the like) out of an operation axis is induced microscopically due to asperities on the spherical surfaces S101 and center misalignment as illustrated in FIG. 12B.

Therefore, the applicant of the present application notes that micro-deformation of a portion that has been treated as a "rigid body" actually occurs, and the position of the protrusion 14 is optimized. Thus, the movable section 12 is allowed to be more efficiently braked, and a configuration capable of responding to miniaturization is achieved.

More specifically, in this embodiment, the movable section 12 is movably held along the Y direction in the cavity 10A of the substrate 10. This movable section 12 includes a plurality of first shaft portions 12A as substantially rigid bodies that are arranged to extend along the Y direction and to be line-symmetric to each other. In such a movable section 12, when an external impact is applied thereto, amounts of movement in the third shaft portion 12C and the first shaft portions 12A are relatively large; therefore, micro-deformation of the movable section 12 occurs. Therefore, in the movable section 12, locally excessive movement (movement out of the operation axis Z (off the axis) or movement exceeding the allowable range on the operation axis Z) may occur. The movable section 12 is efficiently braked by providing the protrusions 14 on the extended lines of the first shaft portions 12A, thereby effectively suppressing such excessive movement.

Figure 13A:
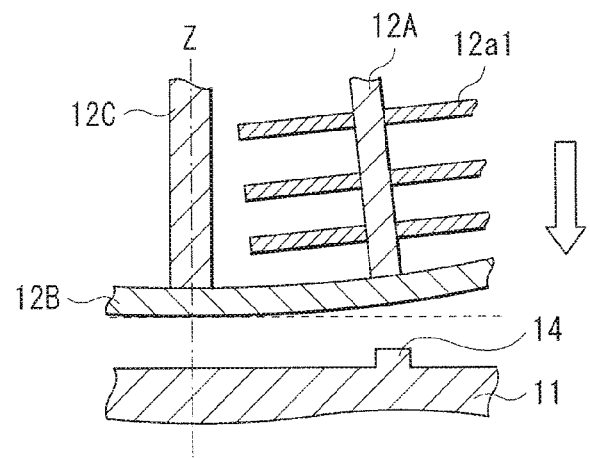
FIG. 13A is a schematic view for describing a braking operation of the movable section by the protrusion illustrated in FIG. 1.
Figure 13B:
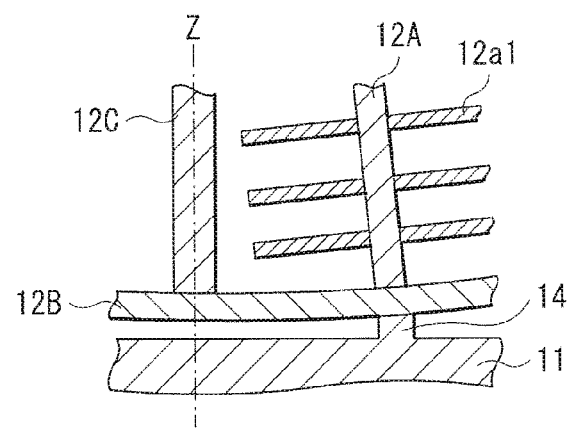
FIG. 13B is a schematic view for describing the braking operation of the movable section by the protrusion illustrated in FIG. 1.
Figure 13C:
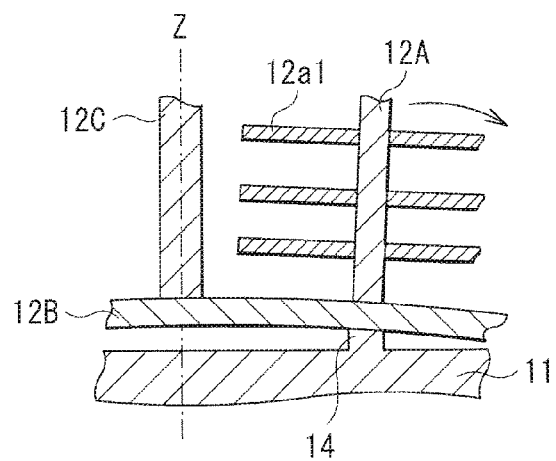
FIG. 13C is a schematic view for describing the braking operation of the movable section by the protrusion illustrated in FIG. 1.

For example, as illustrated in FIG. 13A, in a period from when movement of the movable section 12 starts to when the movable section 12 comes into contact with the protrusion 14, in the movable section 12, the first shaft portions 12A and the third shaft portion 12C as the substantially rigid bodies relatively easily move. More specifically, the third shaft portion 12C including the mass center point moves fastest. Therefore, the second shaft portion 12B is slightly curved or bent to be convex downward (toward a side opposite to the first shaft portion 12A). After that, as illustrated in FIG. 13B, when the movable section 12 comes into contact with the protrusion 14, the movable section 12 is braked. Then, after the contact, as illustrated in FIG. 13C, the first shaft portion 12A is slightly inclined toward a direction where the first shaft portion 12A opens outward (rotation movement (rotation) of the first shaft portion 12A occurs). At this time, the second shaft portion 12B is slightly curved or bent to be convex upward (toward a side of the first shaft portion 12A); however, the amount of such movement is smaller than that in the above-described Comparative Example 1-1.

Thus, in this embodiment, the amount of movement (the amount of movement out of the operation axis Z) by micro-deformation is allowed to be reduced, compared to the above-described comparative examples. For example, in this embodiment, even in a case where the number of movable electrodes 12a1 arranged side by side is 600, the amount of movement out of the operation axis Z may be suppressed to, for example, about 40 nm or less. Thus, since the protrusions 14 are located on the extended lines of the first shaft portions 12A, excessive movement before and after the movable section 12 comes into contact with the protrusion 14 is allowed to be efficiently controlled.

It is to be noted that the operation of the movable section 12 illustrated in FIGS. 13A to 13C is an example. For example, the shape of the movable section 12 before and after the contact may be changed depending on slight magnitude of elasticity of the second shaft portion 12B (magnitude of spring properties). In other words, in a case where the spring properties of the second shaft portion 12B are relatively weak, as illustrated in FIG. 13A, the shape of the second shaft portion 12B before the movable section 12 comes into contact with the protrusion 14 tends to be curved to be convex downward. On the other hand, in a case where the spring properties of the second shaft portion 12B are relatively strong, the shape of the second shaft portion 12B tends to be curved to be concave downward.

Therefore, in this embodiment, even in a case where the movable section 12 is miniaturized to achieve further downsizing and further voltage reduction, occurrence of electrode breakdown is allowed to be suppressed. Moreover, for example, for use in the acceleration sensor, for example, sensitivity of sensing such as an inertial force and angular velocity is allowed to be improved accordingly. Alternatively, for use in the switch, a driving force is allowed to be improved.

As described above, in the MEMS device 1 according to this embodiment, the movable section 12 movable along the Y direction in the surface of the substrate 10 includes a plurality of first shaft portions 12A having relatively high rigidity, and the plurality of first shaft portions 12A are arranged side by side to extend along the Y direction and to be line-symmetric to one another. When an external impact is applied to the MEMS device 1, micro-deformation of the movable section 12 may occur to cause locally excessive movement; however, since the protrusions 14 are provided on the extended lines of the first shaft portions 12A, such excessive movement of the movable section is allowed to be effectively suppressed. Therefore, downsizing and voltage reduction are achievable while securing impact resistance.

Other embodiments of the MEMS device according to the above-described first embodiment will be described below. It is to be noted that like components are denoted by like numerals as of the above-described first embodiment and will not be further described.

Second Embodiment

[Configuration]

Figure 14:
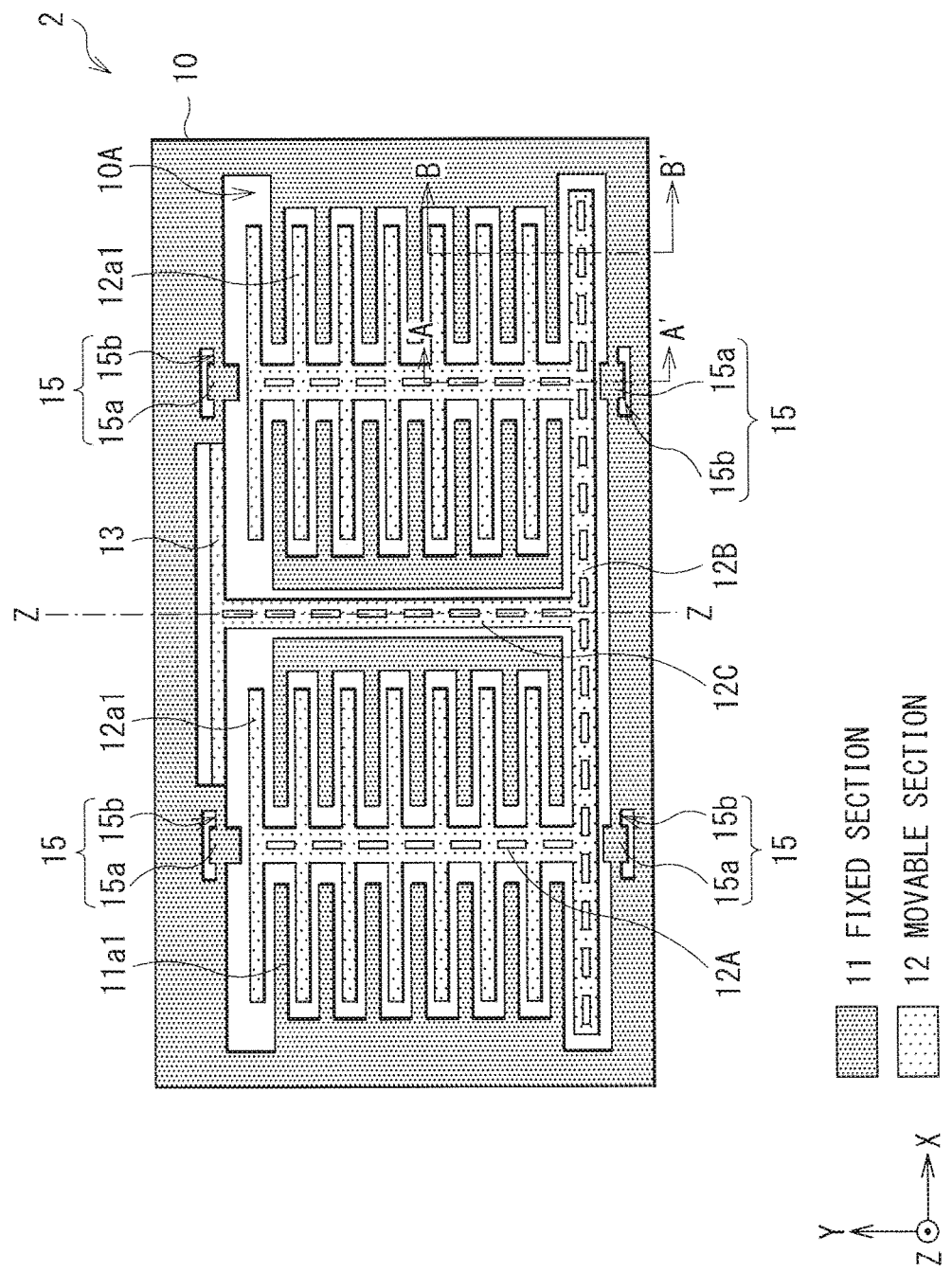
FIG. 14 is a schematic plan view illustrating a configuration of a functional device (a MEMS device) according to a second embodiment of the present disclosure.

FIG. 14 illustrates an XY planar configuration of a functional device (a MEMS device 2) according to a second embodiment of the present disclosure. In the MEMS device 2, as with the MEMS device 1 according to the above-described first embodiment, the fixed section 11 and the movable section 12 are collectively formed by performing three-dimensional microfabrication on the substrate 10, and the movable section 12 is movably suspended in the cavity 10A of the substrate 10. Moreover, the movable section 12 includes a plurality of first shaft portions 12A that are arranged side by side to be line-symmetric to one another, the second shaft portion 12B connected to the first shaft portions 12A, and the third shaft portion 12C. A plurality of movable electrodes 12a1 are provided to the first shaft portions 12A of the movable section 12, and a plurality of fixed electrodes 11a1 corresponding to the movable electrode s12a1 are provided to the fixed section 11.

Moreover, even in this embodiment, protrusions (protrusions 15a) are provided on the extended lines of the first shaft portions 12A of the above-described movable section 12. However, in this embodiment, each of the protrusions 15a is arranged in the fixed section 11 with a leaf spring 15b in between (each of the protrusions 15a is suspended in the fixed section 11 by the leaf spring 15b). The protrusions 15a and the leaf springs 15b brake the movable section 12 as mechanical stoppers (stoppers 15).

Figure 15:
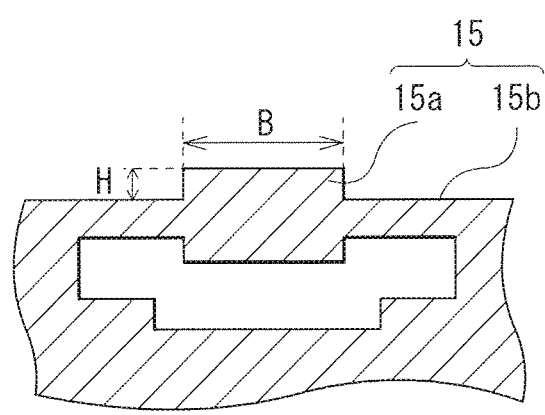
FIG. 15 is a schematic enlarged view around a stopper illustrated in FIG. 14.
Figure 16A:
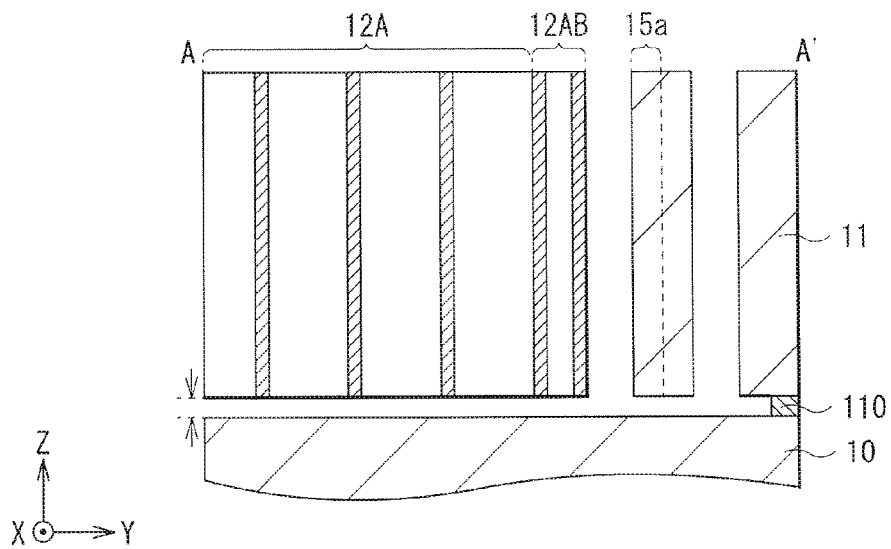
FIG. 16A is a sectional view taken along an A-A' line of FIG. 14.
Figure 16B:
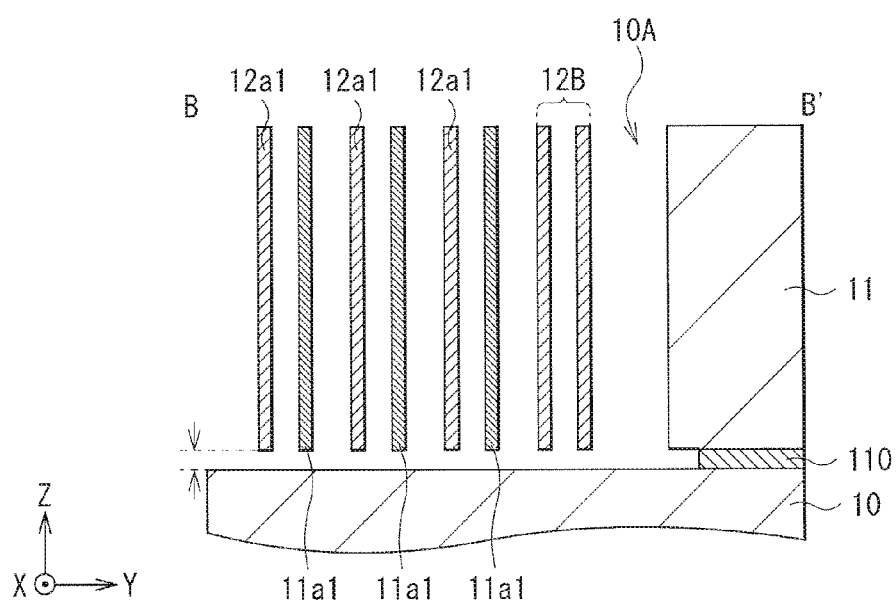
FIG. 16B is a sectional view taken along a B-B' line of FIG. 14.

FIG. 15 illustrates an enlarged view around the stopper 15. FIG. 16A illustrates a sectional configuration taken along an A-A' line of FIG. 14, and FIG. 16B illustrates a sectional configuration taken along a B-B' line of FIG. 14. As with the protrusions 14 in the above-described first embodiment, the stoppers 15 may be formed in one or both of the movable section 12 and the cavity 10A (more specifically, the wall surface of the cavity 10A). Moreover, each of the stoppers 15 may be preferably provided to face the connection section 12AB between the first shaft portion 12A and the second shaft portion 12B. Even in this embodiment, as with the above-described first embodiment, the stoppers 15 are provided to the wall surface of the cavity 10A (the side surface of the fixed section 11) on ends on both sides of the first shaft portions 12A. More specifically, the stoppers 15 are arranged in total four positions facing ends on both sides of two first shaft portions 12A arranged line-symmetrically with respect to the operation axis Z. Ease of processing is enhanced by providing the stoppers 15 to the fixed section 11. This is because a layout space is secured more easily in the fixed section 11 than in the movable section 12, and a spring constant of the leaf string 15b is easily designed. Moreover, there are advantages in that movement such as vibration and resonance of an entire mechanism is reduced by absorbing bouncing and the size of the movable section 12 is allowed to be minimized. Alternatively, the stoppers 15 may be provided to the movable section 12.

The stoppers 15 may be formed integrally with the fixed section 11 (the substrate 10). In other words, the protrusions 15a and the leaf springs 15b are collectively formed together with the movable section 12, the cavity 10A, and the like in the substrate 10 by etching using lithography.

As with the protrusions 14 in the above-described first embodiment, as described above, the protrusions 15a are provided on substantially extended lines of the first shaft portions 12A, and each of the protrusions 15a may be preferably provided in a position slightly shifted from a position directly facing an end of the first shaft portion 12A. Moreover, a width B and the height H of the protrusion 15a are set to appropriate sizes according to magnitude of an external force, rigidity of the movable section 12, and the like. Further, the number and the shape of the protrusions 15a may be similar to those in the above-described first embodiment. Each of the protrusions 15a may be arranged at the center of the leaf spring 15b, or may be arranged in a position slightly shifted from the center, based on a resonance mode of the movable section 12. This is because a braking effect by the protrusion 15a is enhanced. For example, the movable section 12 is opened outward more easily than inward (an effective mass of a resonance mode in which the movable section 12 is opened outward is large); therefore, the position of the protrusion 15a is allowed to respond to displacement of a barycenter position by the resonance mode by arranging the protrusion 15a slightly outside the center.

Figure 17:
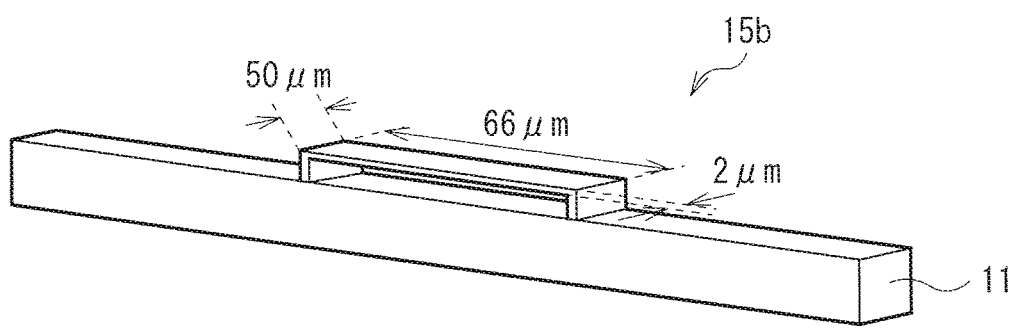
FIG. 17 is a perspective view illustrating an example of a leaf string illustrated in FIG. 15.

The leaf spring 15b may be preferably formed to hold the protrusion 15a and to have elasticity to a degree that micro-deformation occurs upon application of a predetermined impact force or more. FIG. 17 illustrates an example of the leaf string 15b. The leaf spring 15b may be formed integrally with the substrate 10 (silicon) to have, for example, a thickness of about 2 µm, a width of about 66 µm, and a depth of about 50 µm. In this case, the leaf spring 15b is illustrated as a so-called both-end leaf string; however, the spring configuration is not limited thereto. For example, in addition to this, a cantilever leaf spring, a ring string, a meander spring, and the like may be used, or a combination of these springs may be used. This is because, by such a spring configuration, a plate portion and a spring portion configuring the movable section 12 and the like are allowed to be collectively formed, the spring constant is allowed to be designed accurately, and reproducibility is allowed to be enhanced.

[Functions and Effects]

Even in the MEMS device 2 according to this embodiment, when an external impact force is applied thereto, the movable section 12 is moved, and in a case where the impact force exceeds the allowable range, electrode breakdown may be caused in the movable electrode 12a1. In this embodiment, the stoppers 15 (the protrusions 15a and the leaf strings 15b) are used to allow a stress applied to the movable section 12 to fall within the allowable range. Excessive movement of the movable section 12 before and after the movable section 12 comes into contact with the protrusions 15a is allowed to be efficiently controlled by providing the protrusions 15a on the extended lines of the first shaft portions 12A. Therefore, even in a case where the MEMS device 2 is miniaturized, occurrence of electrode breakdown upon application of an impact force is allowed to be suppressed. Accordingly, effects similar to those in the above-described first embodiment are allowed to be obtained.

Figure 18:
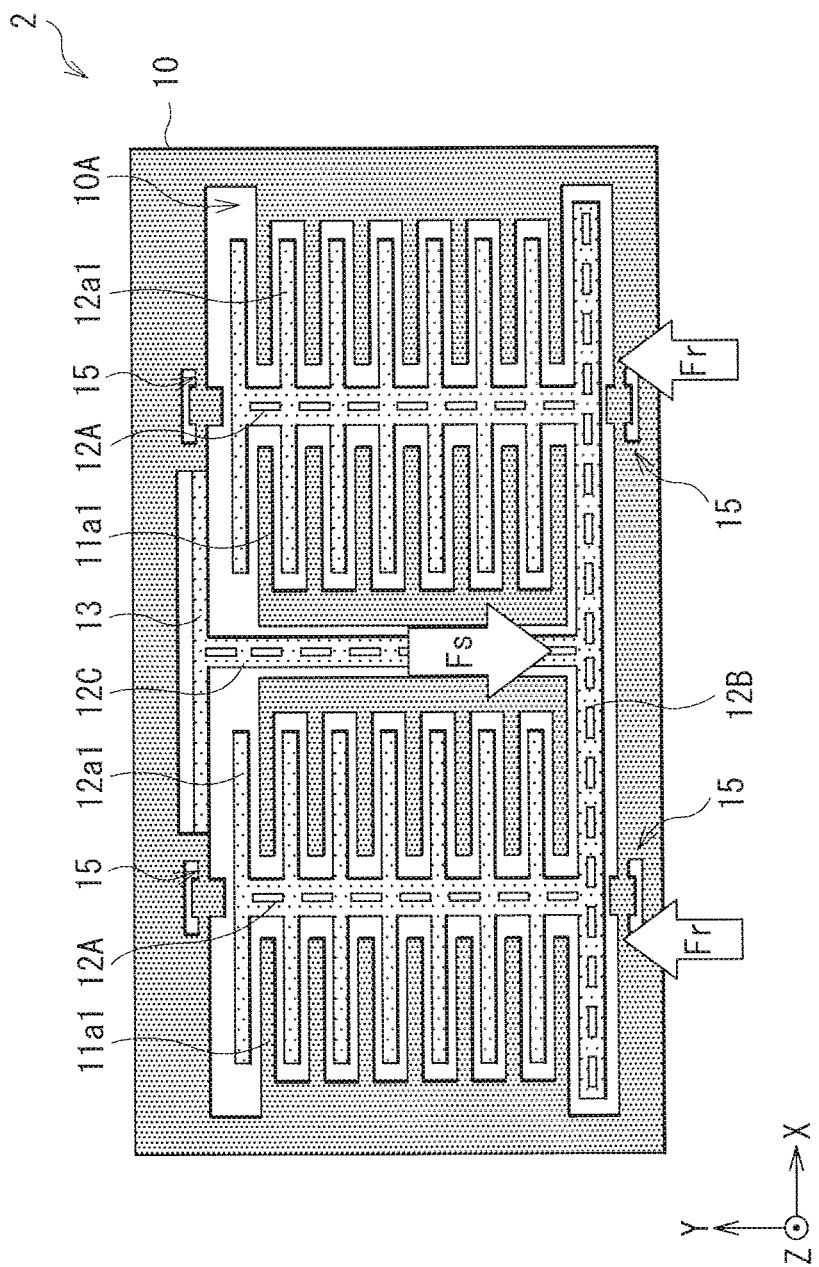
FIG. 18 is a schematic view for describing an effect of the MEMS device illustrated in FIG. 14.

Moreover, in this embodiment, specifically excessive movement (rotation) of the movable section 12 after the contact is allowed to be effectively suppressed by holding the protrusions 15a by the leaf strings 15b (refer to FIG. 18). Further, the MEMS device 2 has the following effect. The deformation time of the leaf spring 15b (necessary time for deformation) is used as an impact relaxation time, and a stress on the movable section 12 is allowed to be further reduced. Moreover, since the amount of movement of the movable section 12 after the contact is allowed to be arbitrarily controlled (for example, by about 10 nm to about a few hundreds of nm), based on the spring constant of the leaf string 15b, an operation upon application of an impact is allowed to be designed more elaborately. In the above-described first embodiment, the amount of movement of the movable section 12 after the contact is determined by rigidity of the first shaft portion 12A and the second shaft portion 12B, but on the other hand, in this embodiment, by using the leaf strings 15b, design flexibility is enhanced, and the amount of movement is easily controlled. In addition, in the MEMS device 2, local displacement, rotation, or the like in the movable section 12 may be caused by an processing error caused along a vertical direction or a horizontal direction or an impact locally applied from an arbitrary direction. Even in a case where such irregular movement of the movable section 12 occurs, the amount of the movement is absorbed by each of the leaf springs 15b provided to respective positions. In other words, a stress applied to the movable section 12 is allowed to be effectively reduced by flexibly responding to irregular movement or the like of the movable section 12.

Third Embodiment

[Configuration]

Figure 19:
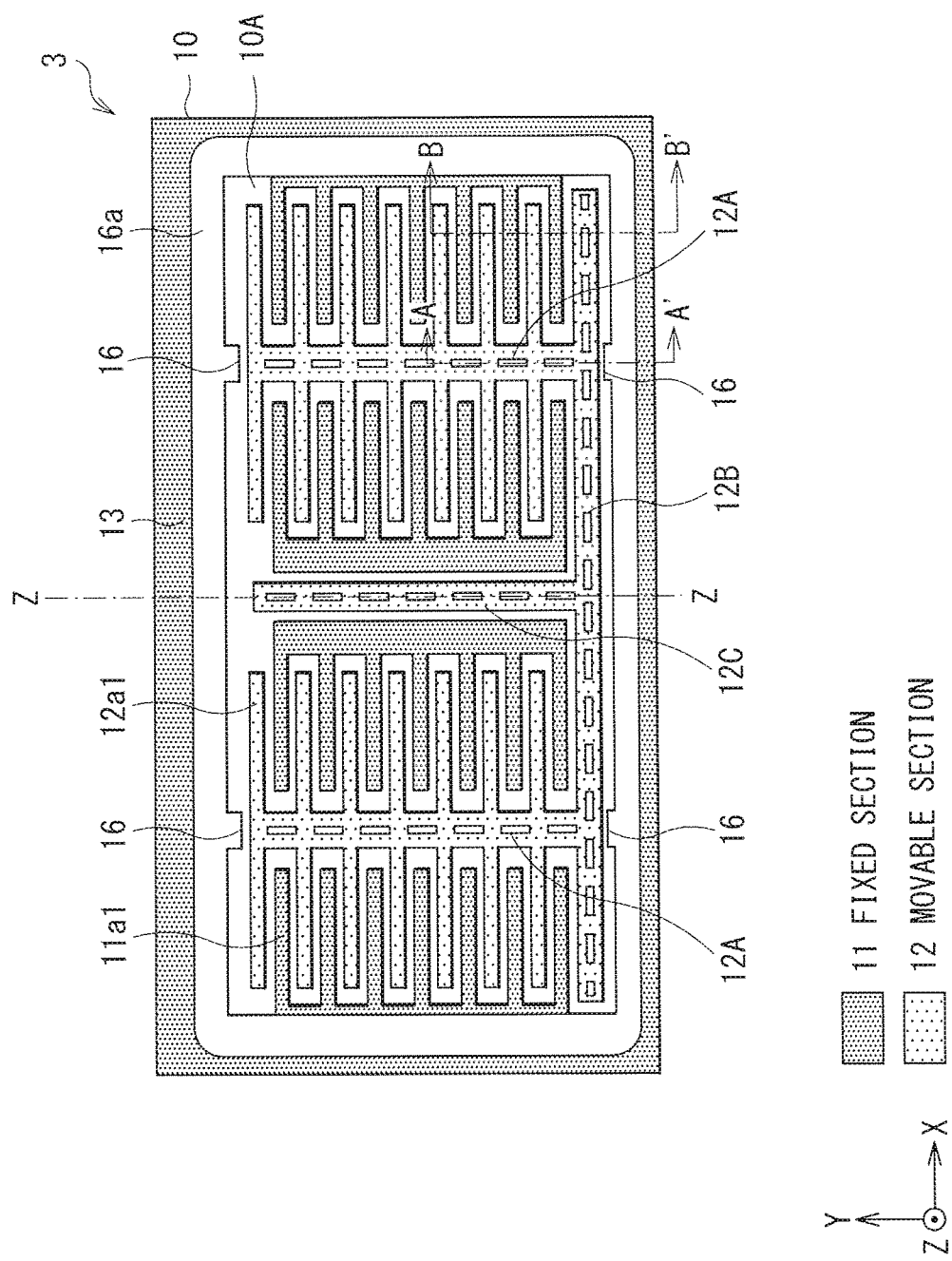
FIG. 19 is a schematic plan view illustrating a configuration of a functional device (a MEMS device) according to a third embodiment of the present disclosure.

FIG. 19 illustrates an XY planar configuration of a functional device (MEMS device 3) according to a third embodiment of the present disclosure. In the MEMS device 3, as with the MEMS device 1 according to the above-described first embodiment, the fixed section 11 and the movable section 12 are collectively formed by performing three-dimensional microfabrication on the substrate 10, and the movable section 12 is movably suspended in the cavity 10A of the substrate 10. Moreover, the movable section 12 includes a plurality of first shaft portions 12A that are arranged side by side to be line-symmetric to one another, the second shaft portion 12B connected to the first shaft portions 12A, and the third shaft portion 12C. A plurality of movable electrodes 12a1 are provided to the first shaft portions 12A of the movable section 12, and a plurality of fixed electrodes 11a1 corresponding to the movable electrodes 12a1 are provided to the fixed section 11.

Even in this embodiment, protrusions (protrusions 16) are provided on the extended lines of the first shaft portions 12A of the above-described movable section 12 as mechanical stoppers. However, in this embodiment, each of the protrusions 16 is covered with an organic film 16a (a part on a surface side of the protrusion 16 is configured of the organic film 16a).

Figure 20A:
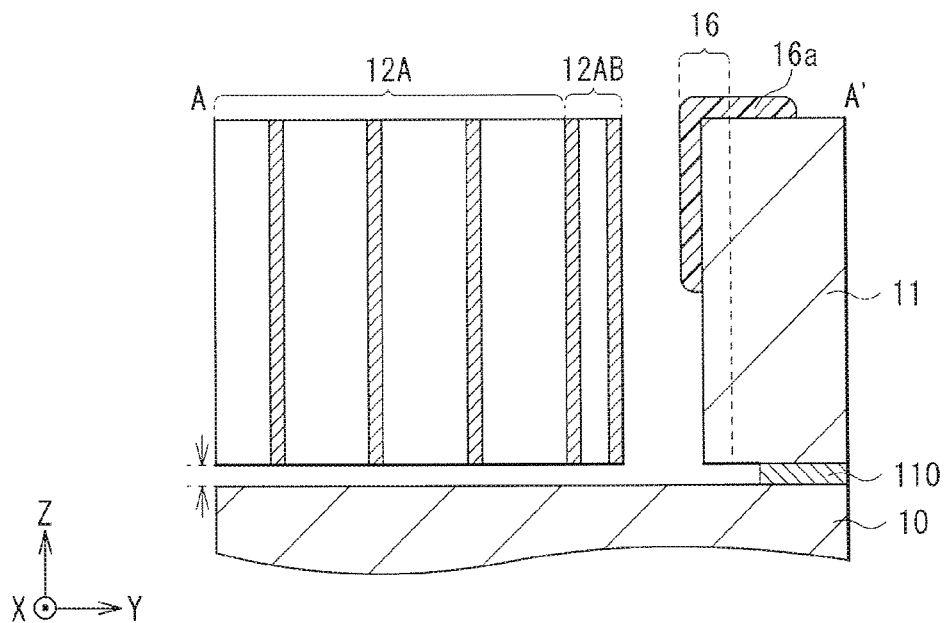
FIG. 20A is a sectional view taken along an A-A' line of FIG. 19.
Figure 20B:
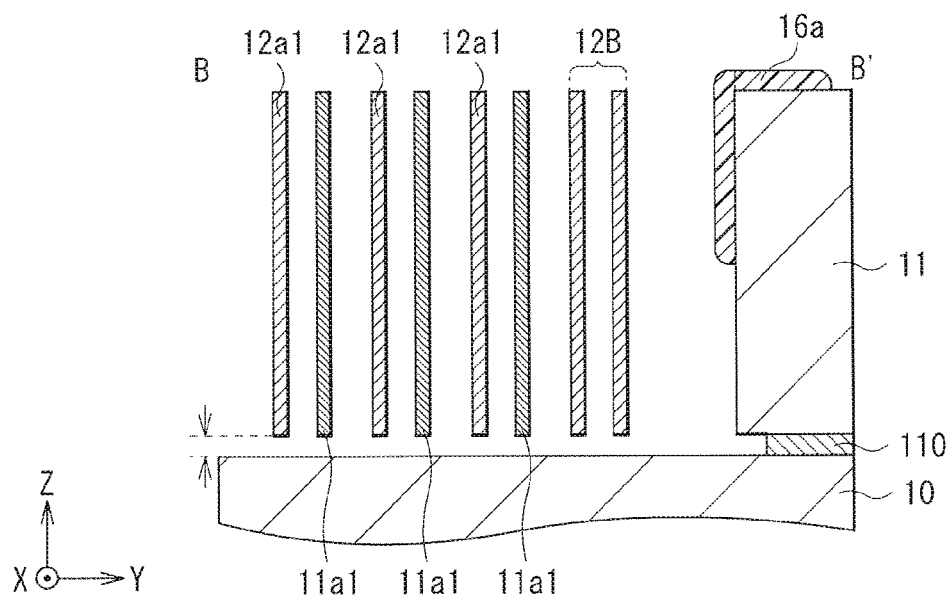
FIG. 20B is a sectional view taken along a B-B' line of FIG. 19.

FIG. 20A illustrates a sectional configuration taken along an A-A' line of FIG. 19, and FIG. 20B illustrates a sectional configuration taken along a B-B' line of FIG. 19. As with the protrusions 14 in the above-described first embodiment, the protrusions 16 may be formed in one or both of the movable section 12 and the cavity 10A (more specifically, the wall surface of the cavity 10A). Moreover, each of the protrusions 16 may be preferably provided to face the connection section 12AB between the first shaft portion 12A and the second shaft portion 12B. Even in this embodiment, as with the above-described first embodiment, the protrusions 16 are provided to the wall surface of the cavity 10A (the side surface of the fixed section 11) on ends on both sides of the first shaft portions 12A. More specifically, the protrusions 16 are arranged in total four positions facing ends on both sides of two first shaft portions 12A arranged line-symmetrically with respect to the operation axis Z.

The organic film 16a may be made of, for example, silicone rubber such as PDMS (polydimethylsiloxane). Affinity with a silicon process is allowed to be secured with use of PDMS. The organic film 16a is allowed to be formed by laminating a laminate film made of such PDMS on the substrate 10 with use of a vacuum sticking device. Alternatively, coating may be performed on a selective region by coating with use of a stencil mask. Moreover, the entire protrusion 16 may be made of such an organic material.

[Functions and Effects]

Even in the MEMS device 3 according to this embodiment, when an external impact force is applied thereto, the movable section 12 is moved, and in a case where the impact force exceeds the allowable range, electrode breakdown may be caused in the movable electrode 12a1. In this embodiment, the protrusions 16 covered with the organic film 16a are used to allow a stress applied to the movable section 12 to fall within the allowable range. Excessive movement of the movable section 12 before and after the movable section 12 comes into contact with the protrusions 16 is allowed to be efficiently controlled by providing the protrusions 16 on the extended lines of the first shaft portions 12A. Therefore, even in a case where the MEMS device 2 is miniaturized, occurrence of electrode breakdown upon application of an impact is allowed to be suppressed. Accordingly, effects similar to those in the above-described first embodiment are allowed to be obtained.

Moreover, in this embodiment, a time constant is increased by covering the protrusion 16 with the organic film 16a, and a stress is allowed to be effectively reduced accordingly. In particular, rotation of the movable section 12 after the contact is allowed to be limited, and driving toward a direction along the operation axis Z (a direction where room for the amount of movement is largest) is allowed to be promoted.

Fourth Embodiment

Figure 21:
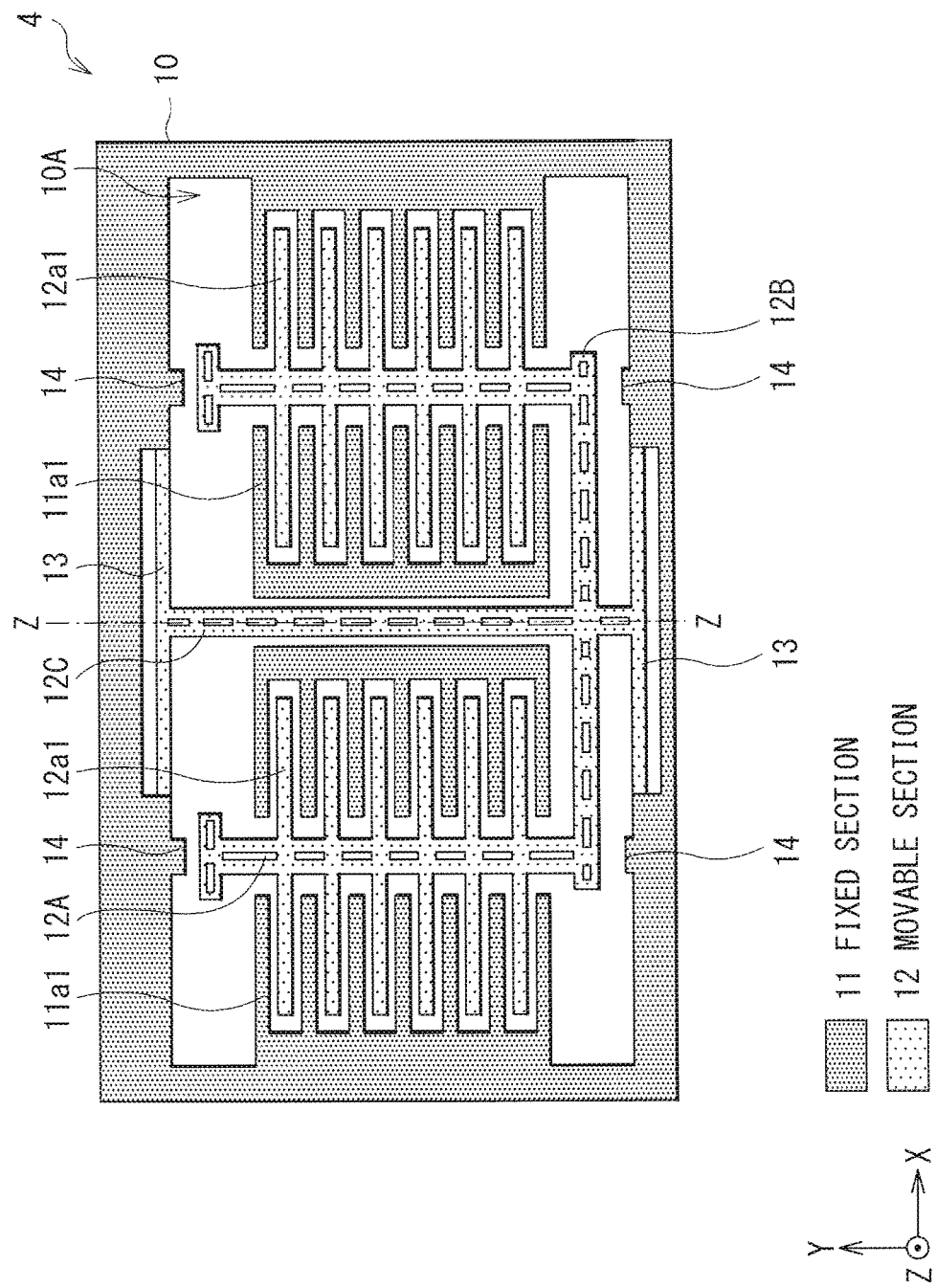
FIG. 21 is a schematic plan view illustrating a configuration of an acceleration sensor according to a fourth embodiment of the present disclosure.

FIG. 21 illustrates an XY planar configuration of an acceleration sensor (an acceleration sensor 4) according to a fourth embodiment of the present disclosure. The MEMS devices (for example, the MEMS device 1) described in the above-described first embodiment and the like are applicable to the acceleration sensor 4 according to this embodiment. The acceleration sensor 4 may be, for example, a capacitance detection system sensor.

In the acceleration sensor 4, the positions of the movable electrodes 12a1 in the no-voltage application state may be preferably arranged, for example, at equal intervals (refer to FIG. 5A) as described above. In the acceleration sensor 4, for example, change in capacitance between the fixed electrodes 11a1 and the movable electrodes 12a1 through a signal line (not illustrated) is allowed to be measured, thereby detecting acceleration by arithmetic processing, based on a measurement result. When the MEMS device according to any of the above-described embodiments and the like is integrated into the acceleration sensor 4, while impact resistance is secured, sensitivity of sensing is allowed to be improved by reducing electrode intervals.

Fifth Embodiment

Figure 22:
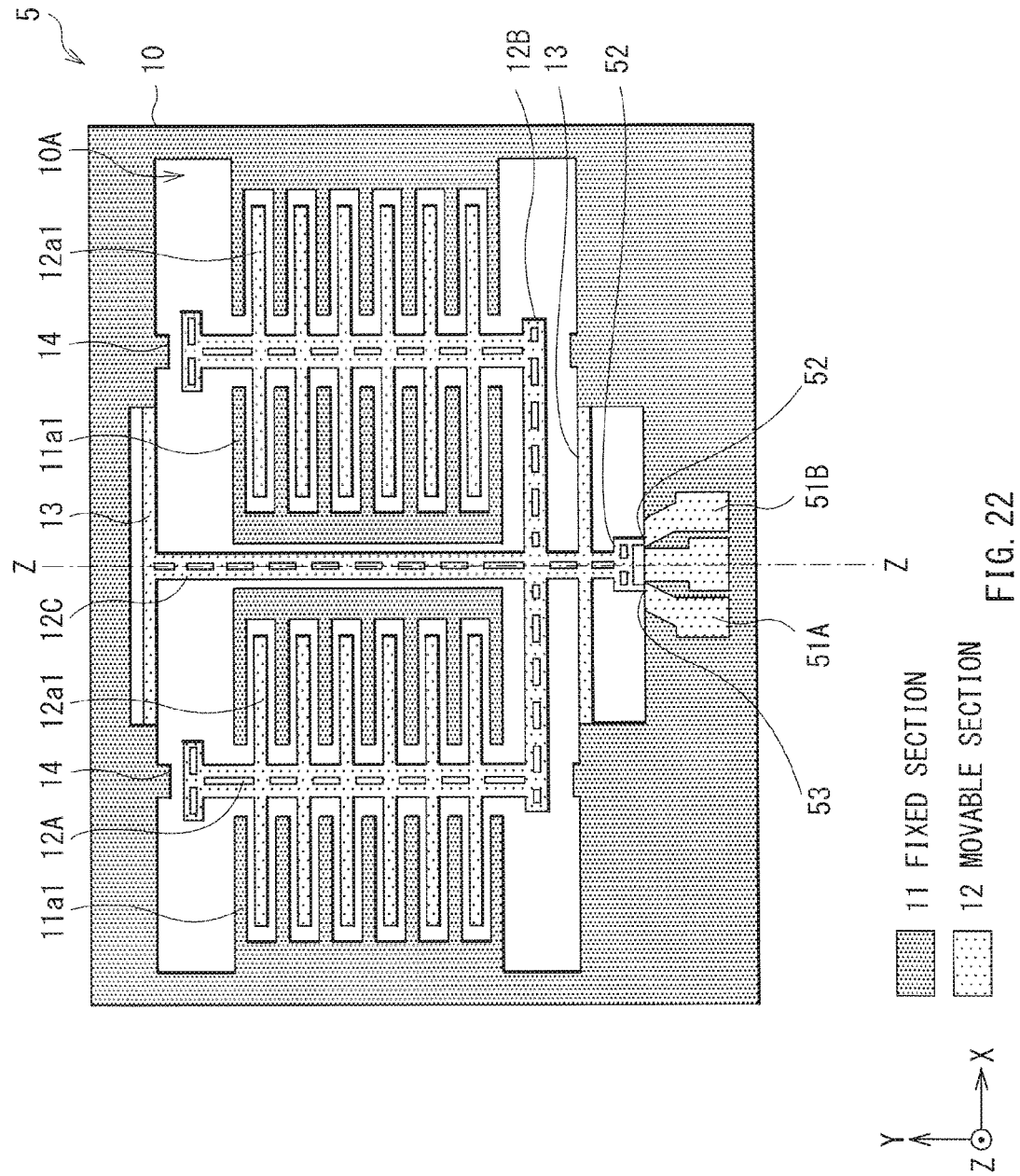
FIG. 22 is a schematic plan view illustrating a configuration of a switch according to a fifth embodiment of the present disclosure.

FIG. 22 illustrates an XY planar configuration of a switch (a switch 5) according to a fifth embodiment of the present disclosure. The MEMS devices (for example, the MEMS device 1) are applicable to the switch 5 according to this embodiment. The switch 5 may be, for example, an electrostatic drive system high-frequency switch. In the switch 5, for example, an input line 51A and an output line 51B may be provided to the fixed section 11, and a conductive portion 52 is provided to the movable section 12. The conductive portion 52 has a contact point 53 that is allowed to come into contact with each of the input line 51A and the output line 51B.

In the switch 5, the positions of the movable electrodes 12a1 in the no-voltage application state may be preferably offset, for example, as described above (refer to FIG. 5B). In the switch 5, in the no-voltage application state, the conductive portion 52 is in a state in which the conductive portion 52 is not in contact with each of the input line 51A and the output line 51B; therefore, the input line 51A and the output line 51B are not electrically connected to each other (the switch 5 is in an OFF state). On the other hand, for example, when a potential difference is caused between the fixed electrodes 11a1 and the movable electrodes 12a through a signal line (not illustrated), the movable section 12 is driven and moved by an electrostatic force, and the input line 51A and the output line 51B come into contact with each other through the contact point 53. Accordingly, the input line 51A and the output line 52 are electrically connected to each other (the switch 5 is turned to an ON state). When the MEMS device according to any of the above-described embodiments and the like is integrated into the switch, while impact resistance is secured, intervals between electrodes are allowed to be further reduced, and a switch driving force is allowed to be improved (driving at lower voltage is allowed to be achieved).

Although the present disclosure is described referring to the embodiments and the modification examples thereof, the present disclosure is not limited thereto, and may be variously modified. For example, in the above-described embodiments and the like, a configuration in which in the movable section 12, two first shaft portions 12A are arranged side by side to be line-symmetric to each other is exemplified; however, the number of the arranged first shaft portions 12A is not limited to two, as long as the first shaft portions 12A have line symmetry, and the number of the first shaft portions 12A may be four or more.

Moreover, the effects described in the above-described embodiments and the like are merely examples; therefore, the present disclosure may have other effects, or may further have other effects.

It is to be noted that the present disclosure may have the following configurations.

(1) A functional device including:
a substrate; and
a movable section configured to be held by the substrate and to be movable along a first direction in a surface of the substrate,
in which the movable section includes a plurality of first shaft portions with relatively high rigidity,
the plurality of first shaft portions are arranged side by side to extend along the first direction and to be line-symmetric to one another, and
protrusions configured to brake the movable section are provided on substantially extended lines of the first shaft portions.

(2) The functional device according to (1), in which
the substrate has a recessed section,
the movable section is movably held in the recessed section, and
the protrusions are provided to one or both of the movable section and the recessed section.

(3) The functional device according to (1) or (2), in which each of the protrusions is held by the movable section or the substrate with a spring in between.

(4) The functional device according to (3), in which the protrusions and the springs are formed integrally with the substrate.

(5) The functional device according to any one of (1) to (4), in which a part on a surface side or a whole of each of the protrusions is configured of an organic film.

(6) The functional device according to any one of (1) to (5), in which the protrusions are provided in positions shifted from position directly facing the first shaft portions toward a mass center point of the movable section.

(7) The functional device according to any one of (1) to (6), in which the movable section includes a second shaft portion connected to one end or both ends of each of the plurality of first shaft portions, and
each of the protrusions is provided to face a connection point between each of the first shaft portions and the second shaft portion.

(8) The functional device according to any one of (1) to (7), in which
the movable section includes a third shaft portion supporting the first and second shaft portions, and the plurality of first shaft portions have line symmetry with respect to the third shaft portion.

(9) The functional device according to any one of (1) to (8), in which the protrusions are provided to ends on one side or ends on both sides of the first shaft portions.

(10) The functional device according to any one of (1) to (9), in which
the movable section includes a plurality of first electrodes provided to be protruded from each of the first shaft portions, and
a plurality of second electrodes are further included, the second electrodes being provided integrally with the substrate and alternately arranged with the first electrodes of the movable section.

(11) The functional device according to (10), in which the movable section is driven by an electrostatic force generated between the first electrodes and the second electrodes.

(12) An acceleration sensor provided with a functional device, the functional device including:
a substrate; and
a movable section configured to be held by the substrate and to be movable along a first direction in a surface of the substrate,
in which the movable section includes a plurality of first shaft portions with relatively high rigidity,
the plurality of first shaft portions are arranged side by side to extend along the first direction and to be line-symmetric to one another, and
protrusions configured to brake the movable section are provided on substantially extended lines of the first shaft portions.

(13) The acceleration sensor according to (12), in which
the movable section includes a plurality of first electrodes provided to be protruded from each of the first shaft portions,
a plurality of second electrodes are further included, the second electrodes being provided integrally with the substrate and alternately arranged with the first electrodes of the movable section, and
the movable section are arranged to allow intervals between the first electrodes and the second electrodes to be equal to one another in a no-voltage application state.

(14) The acceleration sensor according to (13), in which a capacitance generated between the first electrodes and the second electrodes is detected.

(15) A switch provided with a functional device, the functional device including:
a substrate; and
a movable section configured to be held by the substrate and to be movable along a first direction in a surface of the substrate,
in which the movable section includes a plurality of first shaft portions with relatively high rigidity,
the plurality of first shaft portions are arranged side by side to extend along the first direction and to be line-symmetric to one another, and
protrusions configured to brake the movable section are provided on substantially extended lines of the first shaft portions.

(16) The switch according to (15), in which
the movable section includes a plurality of first electrodes provided to be protruded from each of the first shaft portions,
a plurality of second electrodes are further included, the second electrodes being provided integrally with the substrate and alternately arranged with the first electrodes of the movable section, and the movable section is arranged in a position shifted along the first direction from a position where intervals between the first electrodes and the second electrodes are equal to one another in a no-voltage application state.

(17) The switch according to (16), in which the movable section is driven by an electrostatic force generated between the first electrodes and the second electrodes.

It should be understood by those skilled in the art that various modifications, combinations, sub-combinations, and alterations may occur depending on design requirements and other factors insofar as they are within the scope of the appended claims or the equivalents thereof.

What is claimed is:

1. A functional device comprising:
   a substrate; and
   a movable section configured to be held by the substrate and to be movable along a first direction in a surface of the substrate,
   wherein the movable section includes a plurality of first shaft portions with relatively high rigidity,
   the plurality of first shaft portions are arranged side by side to extend along the first direction and to be line-symmetric to one another,
   protrusions configured to brake the movable section are provided on substantially extended lines of the first shaft portions,
   the movable section includes a second shaft portion connected to one end or both ends of each of the plurality of first shaft portions,
   each of the protrusions is provided to face a connection point between each of the first shaft portions and the second shaft portion,
   the movable section includes a third shaft portion supporting the first and second shaft portions, and
   the plurality of first shaft portions have line symmetry with respect to the third shaft portion.

2. The functional device according to claim 1, wherein the substrate has a recessed section,
   the movable section is movably held in the recessed section, and
   the protrusions are provided to one or both of the movable section and the recessed section.

3. The functional device according to claim 1, wherein each of the protrusions is held by the movable section or the substrate with a spring in between.

4. The functional device according to claim 3, wherein the protrusions and the springs are formed integrally with the substrate.

5. The functional device according to claim 1, wherein a part on a surface side or a whole of each of the protrusions is configured of an organic film.

6. The functional device according to claim 1, wherein the protrusions are provided in positions shifted from position directly facing the first shaft portions toward a mass center point of the movable section.

7. The functional device according to claim 1, wherein the protrusions are provided to ends on one side or ends on both sides of the first shaft portions.

8. A functional device comprising:
   a substrate; and
   a movable section configured to be held by the substrate and to be movable along a first direction in a surface of the substrate, wherein
   the movable section includes a plurality of first shaft portions with relatively high rigidity,
   the plurality of first shaft portions are arranged side by side to extend along the first direction and to be line-symmetric to one another,
   protrusions configured to brake the movable section are provided on substantially extended lines of the first shaft portions,
   the movable section includes a plurality of first electrodes provided to be protruded from each of the first shaft portions, and
   a plurality of second electrodes are further included, the second electrodes being provided integrally with the substrate and alternately arranged with the first electrodes of the movable section.

9. The functional device according to claim 8, wherein the movable section is driven by an electrostatic force generated between the first electrodes and the second electrodes.

10. An acceleration sensor provided with a functional device, the functional device comprising:
    a substrate; and
    a movable section configured to be held by the substrate and to be movable along a first direction in a surface of the substrate, wherein
    the movable section includes a plurality of first shaft portions with relatively high rigidity,
    the plurality of first shaft portions are arranged side by side to extend along the first direction and to be line-symmetric to one another,
    protrusions configured to brake the movable section are provided on substantially extended lines of the first shaft portions,
    the movable section includes a plurality of first electrodes provided to be protruded from each of the first shaft portions,
    a plurality of second electrodes are further included, the second electrodes being provided integrally with the substrate and alternately arranged with the first electrodes of the movable section, and
    the movable section are arranged to allow intervals between the first electrodes and the second electrodes to be equal to one another in a no-voltage application state.

11. The acceleration sensor according to claim 10, wherein a capacitance generated between the first electrodes and the second electrodes is detected.

12. A switch provided with a functional device, the functional device comprising:
    a substrate; and
    a movable section configured to be held by the substrate and to be movable along a first direction in a surface of the substrate, wherein
    the movable section includes a plurality of first shaft portions with relatively high rigidity,
    the plurality of first shaft portions are arranged side by side to extend along the first direction and to be line-symmetric to one another,
    protrusions configured to brake the movable section are provided on substantially extended lines of the first shaft portions,
    the movable section includes a plurality of first electrodes provided to be protruded from each of the first shaft portions,
    a plurality of second electrodes are further included, the second electrodes being provided integrally with the substrate and alternately arranged with the first electrodes of the movable section, and
    the movable section is arranged in a position shifted along the first direction from a position where intervals between the first electrodes and the second electrodes are equal to one another in a no-voltage application state.

13. The switch according to claim 12, wherein the movable section is driven by an electrostatic force generated between the first electrodes and the second electrodes.

\* \* \* \* \*